United States Patent
Zhou et al.

(10) Patent No.: US 8,504,891 B2
(45) Date of Patent: Aug. 6, 2013

(54) APPARATUS, SYSTEMS AND METHODS INCLUDING NONBINARY LOW DENSITY PARITY CHECK CODING FOR ENHANCED MULTICARRIER UNDERWATER ACOUSTIC COMMUNICATIONS

(75) Inventors: Shengli Zhou, Mansfield, CT (US); Peter Willett, Coventry, CT (US); Jie Huang, Willimantic, CT (US)

(73) Assignee: University of Connecticut, Farmington, CT (US)

( * ) Notice: Subject to any disclaimer, the term of this patent is extended or adjusted under 35 U.S.C. 154(b) by 500 days.

(21) Appl. No.: 12/731,669

(22) Filed: Mar. 25, 2010

(65) Prior Publication Data

US 2011/0029845 A1 Feb. 3, 2011

Related U.S. Application Data

(60) Provisional application No. 61/164,140, filed on Mar. 27, 2009.

(51) Int. Cl.
*H03M 13/00* (2006.01)
*H04J 11/00* (2006.01)

(52) U.S. Cl.
USPC .......................................... 714/758; 370/203

(58) Field of Classification Search
USPC .......... 714/758, 799–804; 370/203; 375/218
See application file for complete search history.

(56) References Cited

U.S. PATENT DOCUMENTS 7,424,662 B2 * 9/2008 Eroz et al. .................. 714/758
7,673,225 B2 * 3/2010 Jeong et al. ................. 714/800
2010/0040163 A1 * 2/2010 Caire et al. .................. 375/261
2010/0311432 A1 * 12/2010 Lauer et al. .................. 455/450
2011/0299628 A1 * 12/2011 Ko et al. ...................... 375/298

OTHER PUBLICATIONS

Taehyuk Kang; Iitis, R.A.; , "Matching pursuits channel estimation for an underwater acoustic OFDM modem," Acoustics, Speech and Signal Processing, 2008. ICASSP 2008. IEEE International Conference on , vol., no., pp. 5296-5299, Mar. 31-Apr. 4 2008.*
Liang Zhao; Jianhua Ge; , "Iterative multi-channel equalization and LDPC decoding for underwater acoustic coherent communications," Information Theory and Information Security (ICITIS), 2010 IEEE International Conference on , vol., no., pp. 1076-1079, Dec. 17-19, 2010.*

(Continued)

*Primary Examiner* — Cynthia Britt
(74) *Attorney, Agent, or Firm* — McCarter & English, LLP

(57) ABSTRACT

Advantageous underwater acoustic (UWA) apparatus, systems and methods are provided according to the present disclosure. The apparatus, systems and methods employ nonbinary low density parity check (LDPC) codes that achieve excellent performance and match well with the underlying modulation. The nonbinary LDPC codes of the proposed apparatus, systems and methods are formed, at least in part, from a generator matrix that has a high density to reduce the peak-to-average-power ratio (PAPR) with minimal overhead. The disclosed apparatus, systems and methods employ nonbinary regular LDPC cycle codes if the constellation is large and nonbinary irregular LDPC codes if the constellation is small or moderate. The nonbinary irregular and regular LDPC codes enable: i) parallel processing in linear-time encoding; ii) parallel processing in sequential belief propagation decoding; and iii) considerable resource reduction on the code storage for encoding and decoding.

21 Claims, 26 Drawing Sheets

(56) References Cited

OTHER PUBLICATIONS

Jie Huang; Shengli Zhou; Willett, P.; , "Nonbinary LDPC Coding for Multicarrier Underwater Acoustic Communications," Oceans 2008—MTS/IEEE Kobe Techno-Ocean , vol., no., pp. 1-6, Apr. 8-11, 2008.*

Jie Huang; Shengli Zhou; Willett, P.; , "Nonbinary LDPC Coding for Multicarrier Underwater Acoustic Communication," Selected Areas in Communications, IEEE Journal on , vol. 26, No. 9, pp. 1684-1696, Dec. 2008.*

Gallager, Low Density Parity Check Codes, Cambridge, MA: MIT Press, 1963.

Tanner, A Recursive Approach to Low Complexity Codes, IEEE Trans. Inform. Theory, vol. 27, pp. 533-547, Sep. 1981.

Divsalar et al., The Design of Trellis Coded Mpsk for Fading Channels: Performance Criteria, IEEE Trans. Commun., vol. 36, No. 9, pp. 1004-1012, Sep. 1988.

Stojanovic, et al., Phase-Coherent Digital Communications for Underwater Acoustic Channels, IEEE Journal of Oceanic Engineering, vol. 19, No. 1, pp. 100-111, Jan. 1994.

Berrou, et al., Near-Optimum Error-Correcting Coding and Decoding: Turbo-Codes, IEEE Trans. Commun., Vo. pp. 1261-1271, Oct. 1996.

Bauml, et al., Reducing the Peak-To-Average Power Ratio of Multicarrier Modulation by Selected Mapping, Electro. Lett., vol. 32, No. 22, pp. 2056-2057, Oct. 1996.

Sipser, et al., Expander Codes, IEEE Trans, Inform. Theory, vol. 42, pp. 1710-1722, Nov. 1996.

Jungnickel, et al., Graphical Codes Revisited, IEEE Trans. Inform. Theory, vol. 43, pp. 136-146, Jan. 1997.

Davey, et al., Monte Carlo Simulations of Infinite Low Density Parity Check Codes Over GF(q), Proc. Of Int. Workshop on Optimal Codes and Related Topics, Bulgaria, Jun. 9-15, 1998. (Available at http://www.inference.phy.cam.ac.uk/is/papers/).

Mackay, et al., Good Error-Correcting Codes Based on Very Sparse Matrices, IEEE Trans. Inform. Theory, vol. 45, No. 2, pp. 399-431, Mar. 1999.

Davey, et al., Low-Density Parity-Check Codes Over GF(q), IEEE Commun. Lett., vol. 2, pp. 165-167, Jun. 1998.

Davey, et al., Error-Correction Using Low-Density Parity-Check Codes, Dissertation, University of Dambridge, 1999.

Rosenthal, at al., Constructions of LDPC Codes Using Ramanujan Graphs and Ideals frrom Margulis, Proceedings of the 38th Annula Allerton Conference on Communication, Control, and Computing, ppl. 248-257, 2000.

Kschischang, et al., Factor Graphs and the Sum-Product Algorithm, IEEE Trans. Inform. Theory, vol. 47, pp. 498-519, Feb. 2001.

Richardson, at al., Design of Provably Good Low-Density Parity-Check Codes, IEEE Trans. Inform. Theory, vol. 47, Feb. 2001.

Breiling, et al., SLM Peak-Power Reduction Without Explicit Side Information, IEEE Commun. Lett., vol. 5, No. 6, pp. 239-241, Jun. 2001.

Zhang, et al., Shuffled Belief Propagation Decoding, Proceedings of the $36^{th}$ Asilomar Conference on Signals, Systems and Computers, vol. 1, pp. 8-15, Nov. 2002.

Song, et al., Reduced-Complexity Decoding of Q-ary LDPC Codes for Magnetic Recording, IEEE Trans, Magn., vol. 39, pp. 1081-1087, Mar. 2003.

Barnault, et al., Fast Decoding Algorithm for LDPC Codes Over $GF(2^q)$, Proc. IEEE Inform. Theory Workshop, pp. 70-73, 2003.

Kfir, et al., Parallel Versus Sequential Updating for Belief Propagation Decoding, Physica A: Statistical Mechanics and its Applications, vol. 330, pp. 259-270, Dec. 2003.

Hu, et al., Binary Representation of Cycle Tannergraph GF(2b) Codes, Proc. International Conference on Communications, vol. 27, No. 1, pp. 528-532, Jun. 2004.

Wymeersch, at al., Log-Domain Decoding of LDPC Codes over GF(q), Proc. IEEE Int. Conf. Commun., pp. 772-776, Paris, France, Jun. 2004.

Guo, et-al., Low Complexity Non-Binary LDPC and Modulation Schemes Communicating Over MIMO Channels, Proc. Of VTC, vol. 2, pp. 1294-1298, Sep. 26-29, 2004.

Hu, et al., Regular and Irregular Progressive Edge-Growth Tanner Graphs, IEEE Trans. On Inform. Theory, vol. 51, Jan. 2005.

Zhang, et al., Shuffled Iterative Decoding, IEEE Trans. Commun., vol. 53, pp. 209-213, Feb. 2005.

Chitre, et al., Performance of Coded OFDM in Very Shallow Water Channels and Snapping Shrimp Noise, Proceedings of MTS/IEEE Oceans, vol. 2, pp. 1-6, 2005.

Gendron, Orthogonal Frequency Division Multiplexing With On-Offkeying: Noncoherent Performance Bounds, Receiver Design and Experimental Results, U.S. Navy Journal of Underwater Acoustics, vol. 58, No. 2, pp. 267-300, Apr. 2006.

Huang, et al., Linear Time Encoding of Cycle $GF(2^p)$ Codes Through Graph Analysis, IEEE Commun. Left., vol. 10, pp. 369-371, May 2006.

Tjader, et al., Efficient Message-Passing Decoding of LDPC Codes Using Vector-Based Messages, Proc. International Symp. On Inform. Theory, Seattle, Wa, pp. 1713-1717, Jul. 2006.

Stojanovic, Low Complexity OFDM Detector for Underwater Channels, Prod. Of MTS/IEEE Oceans Conference, Boston, MA, Sep. 18-21, 2006.

Li, et al., Pilot-Tone Based ZPOFDM Demodulation for an Underwater Acoustic Channel, Proc. Of MTS/IEEE Oceans Coference, Boston, MA, Sep. 18-21, 2006.

Goalic, et al., Channel Coding for Underwater Acoustic Communication System, Proc. Of Oceans, Boston, MA, Sep. 18-21, 2006.

Peng, et al., Design of Nonbinary LDPC Codes Over GF(q) for Multiple-Antenna Transmissions, in Proc. Of Military Communications Conference, Washington, DC, Oct. 23-25, 2006, pp. 1-7, 2006.

Declercq, et al., Decoding Algorithms for Nonbinary LDPC Codes over GF(q), IEEE Trans, Commun., vol. 55, No. 4, pp. 633-643, Apr. 2007.

Voicila, et al, Low Complexity, Low-Memory EMS Algorithm for Non-Binary LDPC Codes, Proc. IEEE International Conference on Commun., pp. 671-676, Glasgow, Scotland, Jun. 24-28, 2007.

Roy, et al, High Rate Communication for Underwater Acoustic Channels Using Multiple Transmitters and Space-Time Coding: Receiver Structures and Experimental Results, IEEE Journal of Oceanic Engineering, Vo. 32, No. 3, pp. 663-688, Jul. 2007.

Li, et al., MIMO-OFDM Over an Underwater Acoustic Channel, Proc. MTS/IEEE Oceans Conference, Vancouver, BC, Canada, Sep. 29 - Oct. 4, 2007.

Li, et al., Multicarrier communications over Underwater Acoustic Channels With Nonuniform Doppler Shifts, IEEE J. Oceanic Eng., vol. 33, No. 2, Apr. 2008.

Li, et al. Scalable OFDM Design for Underwater Acoustic Communications, Proc. Of Intl. Conf. On ASSP, Las Vegas, NV, pp. 5304-5307, Mar. 3 - Apr. 4, 2008.

Huang, et al., Group-Theoretic Analysis of Cayley-Graph-Based Cycle GF(2p) codes, IEEE Trans. Commun., vol. 57, No. 6, pp. 1560-65, Jun. 2009.

Li, et al., MIMO-OFDM for High Rate Underwater Acoustic Communications, IEEE Journal on Oceanic Engineering, vol. 34, No. 4, pp. 634-644, Oct. 2009.

Huang, et al., Structure, Property, and Design of Nonbinary Regular Cycle Codes, IEEE Trans. On Communications, vol. 58, No. 4, pp. 1060-1071, Apr. 2010.

* cited by examiner

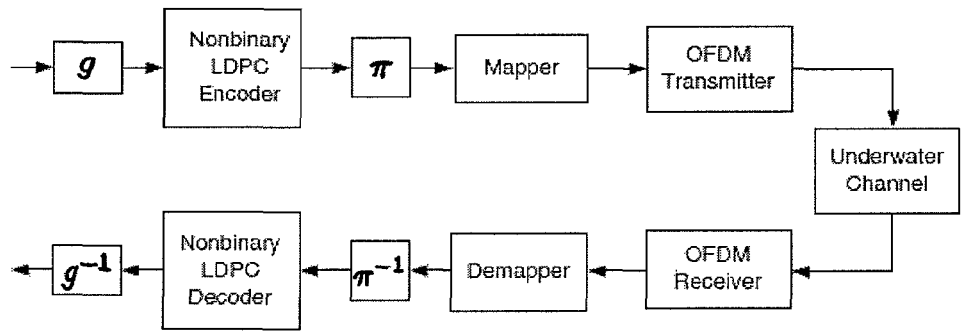
FIG. 1
$$H = \begin{bmatrix} 5 & 0 & 0 & 1 & 0 & 0 & 1 & 0 & 0 & 2 & 0 & 0 \\ 0 & 3 & 0 & 0 & 3 & 0 & 0 & 5 & 0 & 0 & 3 & 0 \\ 1 & 0 & 0 & 0 & 0 & 5 & 0 & 2 & 0 & 0 & 7 & 0 \\ 0 & 0 & 5 & 0 & 6 & 0 & 3 & 0 & 0 & 0 & 0 & 7 \\ 0 & 0 & 2 & 0 & 0 & 3 & 0 & 0 & 1 & 5 & 0 & 0 \\ 0 & 2 & 0 & 4 & 0 & 0 & 0 & 0 & 2 & 0 & 0 & 4 \end{bmatrix}$$
FIG. 2a
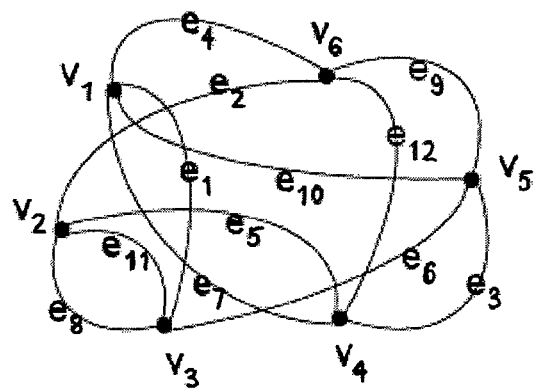
FIG. 2b

APPARATUS, SYSTEMS AND METHODS INCLUDING NONBINARY LOW DENSITY PARITY CHECK CODING FOR ENHANCED MULTICARRIER UNDERWATER ACOUSTIC COMMUNICATIONS

CROSS REFERENCE TO RELATED APPLICATIONS

This application claims the benefit of U.S. Provisional App. Ser. No. 61/164,140 filed Mar. 27, 2009, the entire contents of which is herein incorporated by reference in its entirety.

STATEMENT OF GOVERNMENT SUPPORT

The United States government may hold license and/or other rights in this disclosure as a result of financial support provided by governmental agencies in the development of aspects of the disclosure. Parts of this work were supported by the following grants: Office of Naval Research Grant No. N00014-07-1-0429, Office of Naval Research Young Investigator Program Grant No. N00014-07-1-0805, and National Science Foundation Grant No. ECS-0725562.

BACKGROUND

1. Technical Field

The present disclosure relates to the field of underwater acoustic (UWA) communications. More particularly, the present disclosure relates to enhanced multicarrier UWA communications using nonbinary low density parity check (LDPC) codes (e.g., regular or irregular LDPC codes).

2. Background Art

In general, underwater acoustic (UWA) communication (e.g., the sending and/or receiving of acoustic signals underwater) is a difficult and complex process. The unique characteristics of water as a propagation medium typically contributes to the problematic nature of UWA communication. For example, due to factors such as multi-path propagation and time variations of the channel, it is necessary to account for, inter alia, small available bandwidth and strong signal attenuation. Moreover, slow propagation speeds typically associated with acoustic signals may lead to significant Doppler shifts and spreading. Thus, UWA communication systems are often times limited by reverberation and time variability beyond the capability of receiver algorithms.

Multicarrier underwater acoustic communication, in the form of orthogonal frequency division multiplexing (OFDM), can be used to address some of the difficulties associated with UWA communications. See, e.g., M. Chitre, S. H. Ong, and J. Potter, "Performance of coded OFDM in very shallow water channels and snapping shrimp noise," in *Proceedings of MTS/IEEE OCEANS*, vol. 2, 2005, pp. 996-1001; P. J. Gendron, "Orthogonal frequency division multiplexing with on-offkeying: Noncoherent performance bounds, receiver design and experimental results," *U.S. Navy Journal of Underwater Acoustics*, vol. 56, no. 2, pp. 267-300, April 2006; M. Stojanovic, "Low complexity OFDM detector for underwater channels," in *Proc. of MTS/IEEE OCEANS conference*, Boston, Mass., Sep. 18-21, 2006; and B. Li, S. Zhou, M. Stojanovic, and L. Freitag, "Pilot-tone based ZPOFDM demodulation for an underwater acoustic channel," in *Proc. Of MTS/IEEE OCEANS conference*, Boston, Mass., Sep. 18-21, 2006. OFDM has typically been used because of its capability to handle high-rate transmissions over long dispersive channels. In general, OFDM divides the available bandwidth into a large number of overlapping subbands, so that the symbol duration is long compared to the multipath spread of the channel. As a result, inter-symbol-interference (ISI) may be neglected in each subband, which reduces the complexity of channel equalization at the receiver.

Some of the research associated with OFDM UWA technologies has been focused on how to make OFDM work in the presence of fast channel variations. Experimental results of researchers in the field have demonstrated that OFDM is feasible and flexible for underwater acoustic channels. See, e.g., B. Li, S. Zhou, M. Stojanovic, L. Freitag, and P. Willett, "Multicarrier communications over underwater acoustic channels with nonuniform Doppler shifts," *IEEE J. Oceanic Eng.*, vol. 33, no. 2, April 2008; B. Li, J. Huang, S. Zhou, K. Ball, M. Stojanovic, L. Freitag and P. Willett, "MIMO-OFDM for High Rate Underwater Acoustic Communications," IEEE Journal on Oceanic Engineering, vol. 34, no. 4, pp. 634-644, October 2009; and B. Li, S. Zhou, J. Huang, and P. Willett, "Scalable OFDM design for underwater acoustic communications," in *Proc. of Intl. Conf. on ASSP*, Las Vegas, Nev., Mar. 3-Apr. 4, 2008.

However, two main hurdles should be adequately addressed to successfully deploy OFDM in a practical system: 1) Plain (or uncoded) OFDM has poor performance in the presence of channel fading, since it typically does not exploit the frequency diversity inherent in the channel; and 2) OFDM transmission typically has a high peak-to-average-power ratio (PAPR), and thus a large power backoff reduces the power efficiency and limits the transmission range.

Dedicated studies of coding for underwater acoustic communication are limited. Typically, UWA communication systems employ coding schemes known in the art. For example, trellis coded modulation (TCM) has been used together with single carrier transmission and equalization. See, e.g., M. Stojanovic, J. A. Catipovic, and J. G. Proakis, "Phase-coherent digital communications for underwater acoustic channels," *IEEE Journal of Oceanic Engineering*, vol. 19, no. 1, pp. 100-111, January 1994. Similarly, convolutional codes and Reed Solomon (RS) codes have also been examined for applications in underwater acoustic communication. See, e.g., A. Goalic, J. Trubuil, and N. Beuzelin, "Channel coding for underwater acoustic communication system," in *Proc. of OCEANS*, Boston, Mass., Sep. 18-21, 2006. Further, space time trellis codes and Turbo codes in conjunction with spatial multiplexing have been used for a single-carrier underwater system with multiple transmitters. See, e.g., S. Roy, T. M. Duman, V. McDonald, and J. G. Proakis, "High rate communication for underwater acoustic channels using multiple transmitters and space-time coding: Receiver structures and experimental results," *IEEE Journal of Oceanic Engineering*, vol. 32, no. 3, pp. 663-688, July 2007. In regards to the coding of the OFDM signal, serially concatenated convolutional codes have been used and tested with a non-iterative receiver. See, e.g., M. Chitre, S. H. Ong, and J. Potter, "Performance of coded OFDM in very shallow water channels and snapping shrimp noise," in *Proceedings of MTS/IEEE OCEANS*, vol. 2, 2005, pp. 996-1001.

Low density parity check (LDPC) codes are known to be capacity-achieving codes. See, e.g., R. G. Gallager, *Low Density Parity Check Codes*. Cambridge, Mass.: MIT Press, 1963. LDPC codes have been extensively studied for wireless radio systems. Relative to binary LDPC codes, one advantage of nonbinary LDPC codes is that they can be matched very well with underlying modulation. For example, nonbinary LDPC codes were first combined with high order modulation in radio communication systems with two transmitters and two receivers. See. e.g., F. Guo and L. Hanzo, "Low complexity non-binary LDPC and modulation schemes communicating over MIMO channels," in *Proc. of VTC*, vol. 2, pp. 1294-1298, Sep. 26-29, 2004. Further, simulations have shown that an iterative receiver with nonbinary LDPC codes over GF(16) can outperform the best optimized binary LDPC code in both performance and complexity, while a non-iterative receiver with regular LDPC cycle code over GF(256) can achieve much better performance with comparable decoding complexity compared to the binary iterative system. See, e.g., R.-H. Peng and R.-R. Chen, "Design of nonbinary LDPC codes over GF(q) for multiple-antenna transmission," in *Proc. of Military Communications conference* 2006, Washington, D.C., Oct. 23-25 2006, pp. 1-7.

Current OFDM UWA communication systems fail to adequately address the shortcomings of OFDM technologies. Specifically, uncoded or plain OFDM has poor performance in the presence of channel fading and OFDM transmission has a high peak-to-average-power ratio (PAPR). Due to the limited bandwidth, high order constellations are more desirable for multicarrier underwater communication. These and other inefficiencies and opportunities for improvement are addressed and/or overcome by the apparatus, systems and methods (e.g., LDPC based apparatus, systems and methods) of the present disclosure.

SUMMARY

The present disclosure relates to apparatus, systems and methods for facilitating enhanced underwater acoustic (UWA) communications. More particularly, the present disclosure involves apparatus, systems and methods for UWA communications that utilize, at least in part, nonbinary low density parity check (LDPC) codes. In some embodiments, the nonbinary low density parity check codes are irregular, while in other embodiments the nonbinary low density parity check codes are regular. The disclosed approaches use irregular and/or regular nonbinary LDPC codes to address at least two main issues in underwater acoustic OFDM communication: (i) plain OFDM has poor performance in the presence of channel fading; and iii) OFDM transmission has a high peak-to-average-power ratio (PAPR). Some embodiments of the present disclosure include LDPC codes formed from a generator matrix that has a high density, and thus reduces the PAPR considerably with minimal overhead.

In some embodiments, nonbinary irregular LDPC codes are employed, for instance with small or moderate sized constellations (e.g., BPSK, QPSK, 8-QAM and 16-QAM and/or Galois Fields GF(q) where q<64). In one embodiment, a large portion of the parity check matrix of the irregular LDPC codes resembles that of regular LDPC cycle codes, thereby retaining many of the benefits of regular LDPC cycle codes. The other portion of the parity check matrix of the irregular LDPC codes includes a column weight greater than that of the parity check matrix of the regular LDPC cycle codes (i.e., a column weight of greater than 2). Therefore, the irregular LDPC cycle codes can be formed by replacing a portion of the parity check matrix of the regular LDPC codes H with columns of a weight greater than 2. In this way, the irregular LDPC codes can be arranged in a split representation, wherein $H_1$ contains all weight-2 columns and $H_2$ contains all of the columns of a weight greater than 2, thereby improving performance while retaining at least some of the benefits of regular LDPC cycle codes. Of note, simulation and experimental results confirm the excellent performance of the proposed nonbinary irregular LDPC codes. Advantageous design of irregular LDPC codes is also disclosed.

In other embodiments, regular LDPC cycle codes are employed, for instance with large sized constellations (e.g., 64-QAM and/or Galois Fields GF(q) where q≧64). The regular LDPC cycle codes may be employed over GF(q), whose parity check matrix H has fixed column weight j=2 and fixed row weight d. Therefore, the term "nonbinary regular LDPC cycle codes" is used herein to refer to nonbinary LDPC codes that are "cycle codes" in the sense that they have a parity check matrix with a column weight of 2 and "regular" in the sense that they are further constrained with equal weight on all rows.

In this embodiment, any regular cycle GF(q) code's parity check matrix H can be put into a concatenation form of row-permuted block-diagonal matrices after row and column permutations if d is even, or, if d is odd and the code's associated graph contains at least one spanning subgraph that consists of disjoint edges. The equivalent representation of H may enable: i) parallel processing in linear-time encoding; ii) parallel processing in sequential belief propagation decoding, which increases the throughput without compromising performance or complexity; and iii) considerable resource reduction on the code storage for encoding and decoding.

Advantageous design of regular cycle GF(q) codes—that achieve excellent performance, match well with the underlying modulation, and can be encoded in linear time and in parallel—are also disclosed. In one embodiment, the design of regular cycle GF(q) codes consists of the structure design of H and selection of nonzero entries. Three different methodologies may be used to determine the design of the regular cycle GF(q) codes: i) design based on known graphs; ii) computer search based algorithms; and iii) interleaver design based on the equivalent representation of H. In some embodiments, the selection of nonzero entries effectively lowers the performance error floor.

Additional features, functions and benefits of the disclosed apparatus, systems and methods will be apparent from the description which follows, particularly when read in conjunction with the appended figures.

BRIEF DESCRIPTION OF THE DRAWINGS

To assist those of ordinary skill in the art in making and using the disclosed apparatus, systems and methods, reference is made to the appended figures, wherein:

FIG. 1 illustrates a schematic block diagram of a nonbinary low density parity check (LDPC) coded OFDM system.

FIG. 2a depicts an exemplary check matrix over GF(8) with column weight j=2 and row height d=4.

FIG. 2b depicts the associated graph of the exemplary check matrix of FIG. 2a.

DESCRIPTION OF EXEMPLARY EMBODIMENT(S)

Figure 3:
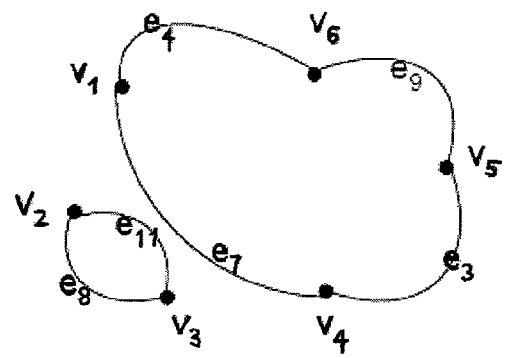
FIG. 3 depicts a 2-factor graph of the associated graph of FIG. 2b.

The present disclosure provides for advantageous apparatus, systems and methods for facilitating enhanced underwater acoustic (UWA) communications. More particularly, the disclosed apparatus, systems and methods generally involve nonbinary irregular and regular low density parity check (LDPC) codes. Advantageously, irregular LDPC cycle codes are employed with small or moderate sized constellations (e.g., BPSK, QPSK, 8-QAM and 16-QAM and/or Galois Fields GF(q) where q is less than about 64) and regular LDPC codes are employed with large sized constellations (e.g., 64-QAM and/or Galois Fields GF(q) where q is greater than or equal to about 64). In general, the regular LDPC codes have a parity check matrix that has a fixed column width weight 2 and a fixed row weight d (hereinafter referred to as "cycle" codes). In an exemplary embodiment, the parity check matrix of the regular cycle code can be placed into a concatenation form of row-permuted block diagonal matrices after row and column permutations if d is even, or, if d is odd and the code's associated graph contains at least one spanning subgraph that consists of disjoint edges.

In another embodiment, a large portion of the parity check matrix of the irregular LDPC codes resembles that of regular LDPC cycle codes, thereby retaining many of the benefits of regular LDPC codes. The remaining portion of the parity check matrix of the irregular LDPC codes includes a column weight greater than that of the parity check matrix of the regular LDPC codes (e.g., a column weight of greater than 2). Therefore, the irregular LDPC codes can be formed by replacing a portion of the parity check matrix of the regular LDPC codes cycle with columns of a weight greater than 2. In this way, the irregular LDPC codes can be arranged in a split representation—e.g., a matrix with weight-2 columns and a matrix wherein the columns are of a weight greater than 2. In this manner the irregular LDPC codes improve performance while retaining at least some of the benefits of regular LDPC codes.

The embodiments of the disclosed apparatus, systems and methods employ the nonbinary regular and irregular LDPC codes to enable parallel processing in linear-time encoding and parallel processing in sequential belief propagation decoding, which increases the throughput without compromising performance or complexity. Embodiments of the LDPC codes achieve excellent performance, match well with the underlying modulation and/or reduce the PAPR considerably with minimal overhead. One embodiment of the disclosed PAPR reduction approach requires multiple rounds of encoding for each information block at the transmitter, hence, the fast and parallel encoding algorithm for the proposed nonbinary LDPC codes is well suited. All publications, applications, patents, figures and other references mentioned herein are incorporated by reference in their entirety.

1. The System, Method and Apparatus

FIG. 1 shows the block diagram of an exemplary underwater OFDM system with nonbinary LDPC coding. Encoding and decoding are performed for each OFDM block separately. See, e.g., B. Li, S. Zhou, M. Stojanovic, L. Freitag, and P. Willett, "Multicarrier communications over underwater acoustic channels with nonuniform Doppler shifts," *IEEE J. Oceanic Eng.*, vol. 33, no. 2, April 2008. In theory, if an LDPC code over GF(q) is used where $q=2^p$, then $\{\alpha_0=0, \alpha_1, \ldots,$ $\alpha_{q-1}\}$ denotes elements in GF(q). Also, a constellation size of $M=2^b$ may be used by the OFDM modulator. One advantage of nonbinary LDPC coding is that the field order can be matched with the constellation size, i.e., p=b. In this manner, one element in GF(q) can be mapped to one point in the signal constellation. In an embodiment where b is small, it may be preferable to choose p>b. Further, if it is assumed that J:=p/b is an integer, each element in GF(q) will be mapped to J symbols drawn from the constellation. Therefore, the mapper may be described as:

$$\alpha_i \rightarrow [\phi^0(\alpha_i), \ldots, \phi^{J-1}(\alpha_i)], i=0, \ldots, q-1 \quad (1)$$

where $\phi^j(\alpha_i)$ is one point in the signal constellation. It can also be assumed that $K_d$ subcarriers are used for data transmission, and the LDPC code rate is r.

Applying the above mentioned assumptions, the transmitter can be said to operate as follows. First, for each OFDM block, $rbK_d$ information bits are mapped to $rbK_d/p$ symbols in GF(q), with every p bits mapped to a single GF(q) symbol through a bit-to-symbol mapper g. Then, the LDPC encoder outputs $bK_d/p$ coded symbols in GF(q), which pass through a coded-symbol interleaver π to obtain a vector $$u=[u[0], \ldots, u[K_d/J-1]]^T \quad (2)$$

In this way, the mapper in the expression enumerated as (1) above, is able to map the vector u to a modulated-symbol vector s:=[s[0] ..., s[Kd−1]]$^T$ as:

$$s=[\phi^0(u[0]), \ldots, \phi^{J-1}(u[0]), \phi^0(u[1]), \ldots, \phi^{J-1}(u[K_d/J-1])]^T \quad (3)$$

The Kd entries of s are thus distributed to the OFDM data subcarriers. An OFDM transmission is then formed after mixing the data subcarriers with pilot and null subcarriers. See, e.g., B. Li, S. Zhou, M. Stojanovic, L. Freitag, and P. Willett, "Multicarrier communications over underwater acoustic channels with nonuniform Doppler shifts," *IEEE J. Oceanic Eng.*, vol. 33, no. 2, April 2008, which is hereby expressly incorporated by reference in its entirety. Using a block-by-block OFDM receiver (such as the one described in the publication cited above) the equivalent channel input-output model on the data subcarriers may be expressed as:

$$y[k]=H[k]s[k]+n[k], k=0, \ldots, K_d-1, \quad (4)$$

where H[k] is the channel frequency response on the kth data subcarrier, y[k] is the output on the kth data subcarrier, and n[k] is the composite noise with contributions from ambient noise, the residual inter-carrier interference (ICI), and the noise induced by channel estimation error. In theory, it can be assumed that n[k] has variance $\sigma^2$ per real and imaginary dimension. Thus, the average signal to noise ratio can be defined as $$|E_s/N_0 = \frac{E_m \cdot E\{|\hat{H}[k]|^2\}}{2\sigma^2}, \quad (5)$$

where $E_m$ is the average symbol energy of the constellation, and |.| denotes the absolute value of a complex number, and E{.} denotes the expectation operation.

When the noise variance $\sigma^2$ is available, the demapper can compute the likelihood $$Pr(u[k]=\alpha_i) \propto \exp\left(\frac{-\sum_{j=0}^{J-1}|y[kJ+j]-H[kJ+j]\phi^j(\alpha_i)|^2}{2\sigma^2}\right), \quad (6)$$

$$k=0, \ldots, K_d/J-1; \quad 1=0, \ldots, q-1.$$

The likelihood values can then be passed to the deinterleaver $\pi^{-1}$/before being passed to the LDPC decoder. The FFT-based q-ary sum-product algorithm (FFT-QSPA) may be used for iterative decoding. See, e.g., H. Song and J. R. Cruz, "Reduced-complexity decoding of q-ary LDPC codes for magnetic recording," *IEEE Trans. Magn.*, vol. 39, pp. 1081-1087, 2003. In an exemplary embodiment, after a finite number of decoding iterations, hard decisions on the nonbinary symbols are made at the output of the LDPC decoder, based on which information bits are found. Unlike a system with binary coding and high order modulation, the proposed system in FIG. 1 and described herein does not require any iterative processing between the demapper and the LDPC decoder.

When the noise variance is not available, the demapper can compute the log-likelihood-ratio vector (LLRV) over GF(q). The LLRV of u[k] is defined as $z[k]=[z_0[k], z_1[k], \ldots, z_{q-1}[k]]^T$, where $$z_i[k] = \ln \frac{Pr(u[k]=\alpha_i)}{Pr(u[k]=0)}. \quad (7)$$

From equation (6), it can be determined that $$z_i[k] = -\frac{1}{2\sigma^2} \quad (8)$$

$$\sum_{j=0}^{J-1}\left(|y[kJ+j]-\hat{H}[kJ+j]\phi^j(\alpha_i)|^2 - |y[kJ+j]-\hat{H}[kJ+j]\phi^j(0)|^2\right).$$

In an exemplary embodiment, the LLRV values are passed to the deinterleaver $\pi^{-1}$ before being passed to the LDPC decoder. The min-sum (MS), or extended min-sum (EMS) algorithms can be used for iterative decoding. See, e.g., D. Declercq and M. Fossorier, "Decoding algorithms for nonbinary LDPC codes over GF(q)," *IEEE Trans. Commun.*, vol. 55, no. 4, pp. 633-643, April 2007; and A. Voicila, D. Declercq, F. Verdier, M. Fossorier, and P. Urard, "Low complexity, low-memory EMS algorithm for non-binary LDPC codes," in *Proc. IEEE International Conf. on Commun.*, Glasgow, Scotland, Jun. 24-28 2007, pp. 671-676. It is noted that the LLRV generated by the expression enumerated as (8) above is proportional to the reciprocal of $\sigma^2$, and the updating rules of the MS (or EMS) decoding algorithm at the check nodes and variable nodes are linear operations with respect to the reciprocal of $\sigma^2$. Therefore, all the messages exchanged during decoding iterations can be proportional to the reciprocal of $\sigma^2$ and the decoding results may remain unchanged with $\sigma^2$ set to an arbitrary value.

It is also noted that when the code alphabet is matched to the modulation alphabet, i.e., p=b, or when p is an integer multiple of b, the interleaver in FIG. 1 is not necessary, as interleaving the coded symbols amounts to shuffling the columns of the parity check matrix of the LDPC code; hence interleaving can be absorbed into the code design. In such cases, the proposed system in FIG. 1 does not require any iterative processing between the demapper and the LDPC decoder regardless of the constellation labelling rules—because the demapper produces the likelihood probabilities (or LLRV) for each coded symbol over GF(q) that are independent of other coded symbols. For other choices of p and b, interleaving and iterative demapping may be useful. It is further noted that for a binary LDPC coded system with high order modulation, (i) other constellation labelling rules (e.g., set partitioning) can improve the system performance relative to Gray labelling, but require iterative processing between the maximum a posterior (MAP) demapper and the LDPC decoder, and (ii) the noise variance must be estimated for demapping.

2. The Proposed Nonbinary LDPC Codes

A. Nonbinary Regular Cycle Code

Gallager's binary LDPC codes are excellent error-correcting codes that achieve performance close to the benchmark predicted by the Shannon theory. See, e.g., R. G. Gallager, *Low Density Parity Check Codes*, Cambridge, Mass.: MIT Press, 1963, and D. J. C. Mackay, "Good error-correcting codes based on very sparse matrices," *IEEE Trans. Inform. Theory*, vol. 45, no. 2, pp. 399-431, March 1999. The extension of LDPC to non-binary Galois field GF(q) was first investigated empirically by Davey and Mackay over the binary-input AWGN channel. See, e.g., M. C. Davey and D. Mackay, "Low-density parity-check codes over GF(q)," *IEEE Commun. Lett.*, vol. 2, pp. 165-167, June 1999. Since then, nonbinary LDPC codes have been actively studied.

The simplest LDPC codes are cycle codes, as their parity check matrices have column weight j=2. See, e.g., D. Jungnickel and S. A. Vanstone, "Graphical codes revisited," *IEEE Trans. Inform. Theory*, vol. 43, pp. 136-146, January 1997. It has been found that the mean column weight of nonbinary LDPC codes must approach 2 when the field order q increases—that is, the best nonbinary LDPC codes for very large q tend to be cycle codes over GF(q). See, e.g., M. C. Davey and D. Mackay, "Monte Carlo simulations of infinite low density parity check codes over GF(q)," in *Proc. of Int. Workshop on Optimal Codes and related Topics*, Bulgaria, Jun. 9-15 1998. Available at http://www.inference.phy.cam.ac.uk/is/papers/; and M. C. Davey, Error-Correction using Low-Density Parity-Check Codes, Dissertation, University of Cambridge, 1999. It is also known that cycle GF(q) codes can achieve near-Shannon-limit performance as q increases and can outperform other LDPC codes, including degree-distribution optimized binary irregular LDPC codes. X.-Y. Hu and E. Eleftheriou, "Binary representation of cycle tannergraph GF(2b) codes," *Proc. International Conference on Communications*, vol. 27, no. 1, pp. 528-532, June 2004.

One main concern of nonbinary LDPC codes with large q is the decoding complexity. An FFT-based q-ary sum-product algorithm (FFT-QSPA) for decoding a general LDPC code over binary extension fields has been proposed, whose decoding complexity increases on the order of O(q log q). See. e.g., H. Song and J. R. Cruz, "Reduced-complexity decoding of q-ary ldpc codes for magnetic recording," *IEEE Trans. Magn.*, vol. 39, pp. 1081-1087, March 2003; and L. Barnault and D. Declercq, "Fast decoding algorithm for LDPC codes over GF($2^q$)," in *Proc. IEEE Inform. Theory Workshop*, 2003, pp. 70-73. There also exists a min-sum version algorithm which works in the log-domain for nonbinary LDPC codes, similar to the min-sum decoding for binary LDPC codes where the Jaccobi operation max* is replaced by the max operation. See, e.g., H. Wymeersch, H. Steendam, and M. Moeneclaey, "Log-domain decoding of LDPC codes over GF(q)," in *Proc. IEEE Int. Conf. Commun.*, Paris, France, June 2004, pp. 772-776. Reduced-complexity decoding algorithms for nonbinary LDPC codes have also been recently developed. See, e.g., M. Tjader, M. Grimnell, D. Danev, and H. M. Tullberg, "Efficient message-passing decoding of LDPC codes using vector-based messages," in *Proc. International Symp. on Inform. Theory*, Seattle, Wash., July 2006, pp. 1713-1717; D. Declercq and M. Fossorier, "Decoding algorithms for nonbinary LDPC codes over GF(q)," *IEEE Trans. Commun.*, vol. 55, no. 4, pp. 633-643, April 2007; and A. Voicila, D. Declercq, F. Verdier, M. Fossorier, and P. Urard, "Low complexity, low-memory EMS algorithm for non-binary LDPC codes," in *Proc. IEEE International Conf. on Commun.*, Glasgow, Scotland, Jun. 24-28 2007, pp. 671-676. Using a geometrical vector representation and the table lookup, an efficient message-passing decoding algorithm for nonbinary LDPC codes over M-ary phase shift keying (PSK) has been developed, which can perform close to the belief propagation decoding algorithm with far less decoding complexity. Truncating the size of extrinsic messages from q to $n_m$, the extended min-sum (EMS) algorithm may reduce the total decoding complexity from the order of O(q log q) to O($n_m$ log $n_m$), where $n_m$ could be much smaller than q. The improved version of the EMS algorithm can further reduce the message storage requirement.

One unique advantage of nonbinary LDPC codes over binary LDPC codes is that nonbinary codes can match very well the underlying modulation, and bypass the need for a symbol-to-bit conversion at the receiver. The present disclosure provides for apparatus, systems and methods that make use of LDPC codes with column weight j=2 in their parity check matrix H, termed as cycle codes. See, e.g., D. Jungnickel and S. A. Vanstone, "Graphical codes revisited," *IEEE Trans. Inform. Theory*, vol. 43, pp. 136-146, January 1997. Although the distance properties of binary cycle codes are not as good as the LDPC codes of column weight j≧3, it has been shown in that cycle GF(q) codes can achieve near-Shannon-limit performance as q increases. See, e.g., R. G. Gallager, *Low Density Parity Check Codes*, Cambridge, Mass.: MIT Press, 1963, and X.-Y. Hu and E. Eleftheriou, "Binary representation of cycle Tanner-graph GF(2b) codes," *IEEE International Conference on Communications*, vol. 27, no. 1, pp. 528-532, June 2004. Further, X.-Y. Hu et al. demonstrated numerical results that show cycle GF(q) codes can outperform other LDPC codes, including degree-distribution-optimized binary irregular LDPC codes. For high order fields (q≧64), the best GF(q)-LDPC codes decoded by belief propagation (BP) are commonly theorized to be ultra sparse, with a good example being the cycle codes that have j=2. See, e.g., M. C. Davey and D. Mackay, "Low-density parity-check codes over GF(q)," *IEEE Commun. Lett.*, vol. 2, pp. 165-167, June 1999, and M. C. Davey, *Error-Correction using Low-Density Parity-Check Codes*, Dissertation, University of Cambridge, 1999.

Reduced complexity algorithms for decoding a general LDPC code over GF(q) have also been proposed. See, e.g., H. Song and J. R. Cruz, "Reduced-complexity decoding of Q-ary LDPC codes for magnetic recording," *IEEE Trans. Magn.*, vol. 39, pp. 1081-1087, March 2003, and L. Barnault and D. Declercq, "Fast decoding algorithm for LDPC codes over GF(2q)," in *Proc. IEEE Inform. Theory Workshop*, pp. 70-73, 2003. A universal linear-complexity encoding algorithm for any cycle GF(q) code has also been determined. See, e.g., J. Huang and J.-K. Zhu, "Linear time encoding of cycle GF($2^p$) codes through graph analysis," *IEEE Commun. Lett.*, vol. 10, pp. 369-371, May 2006. As such, the performance and implementation advantages of cycle GF(q) codes make them promising for practical applications.

One popular representation of LDPC codes is based on the Tanner-graph, which is a bipartite graph with m constraint (check) nodes and n variable nodes connected by edges specified by the nonzero entries in the parity check matrix H of size m×n. See, e.g., R. M. Tanner, "A recursive approach to low complexity codes," *IEEE Trans. Inform. Theory*, vol. 27, pp. 533-547, September 1981. In preferred embodiments of the apparatus, systems and methods disclosed herein, cycle GF(q) codes can be represented using an associated graph G with m vertices and n edges, where each vertex represents one constraint node corresponding to one row of H, and each edge represents one variable node corresponding to one column of H. See, e.g., J. Huang and J.-K. Zhu, "Linear time encoding of cycle GF(2p) codes through graph analysis," *IEEE Commun. Lett.*, vol. 10, pp. 369-371, May 2006. If the row weight of H for a cycle code is fixed as d, then each vertex of its associated graph G may be exactly connected to d edges. Such a graph is d-regular, and such a LDPC code is defined as a regular cycle code over GF(q) herein. See, e.g., D. Reinhard, *Graph Theory*, 2nd edition, Springer-Verlag, 2000.

In preferred embodiments, UWA communication apparatus, systems and methods include a cycle GF(q) code—an LDPC code whose m×n parity check matrix H has weight j=2 for each column. As such, in the preferred embodiments the cycle GF(q) code can be represented by an associated graph $G=(V,E)$ with m vertices $V=\{v1, \ldots, v_m\}$ and n edges $E=\{e_1, \ldots, e_n\}$, where each vertex represents a constraint node corresponding to a row of H, and each edge represents a variable node corresponding to a column of H, as shown in FIGS. 2a and 2b. If the cycle GF(q) code also has a fixed row weight d in H, the graph G is d-regular in that each vertex is exactly linked to d edges. This code will be referred to as regular cycle GF(q) code hereinafter. Of note, 2n=dm for regular cycle GF(q) codes. Further, when H is full row-rank, H defines a regular cycle GF(q) code of rate R=(d−2)/d.

Figure 4A:
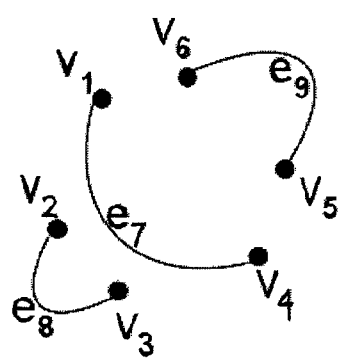
FIG. 4a depicts a 1-factor split graph from the 2-factor graph of FIG. 3.
Figure 4B:
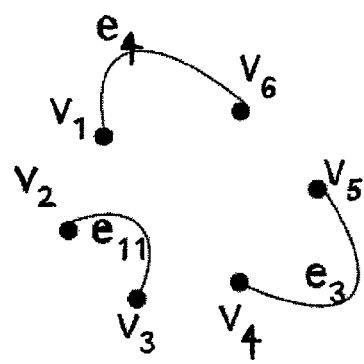
FIG. 4b depicts the companion 1-factor split graph of FIG. 4a from the 2-factor graph of FIG. 3.

It is herein proposed that the graph theory is an advantageous way to analyze regular cycle GF(q) codes. Before analysis, it is noted that the term "k-factor" is defined as a k-regular spanning subgraph of G that contains all the vertices, and the term "k-factorable" is defined as a graph G with edge-disjoint k-factors $G_1, G_2 \ldots, G_L$ such that $G=G_1 \cup G_2 \ldots, \cup G_L$. Thus, a 1-factor is a spanning subgraph that consists of disjoint edges, while a 2-factor is a spanning subgraph that consists of disjoint cycles, as shown in FIGS. 3-4b. For a subgraph G' of G, it can be assumed that $H_{G'}$ be the sub-matrix of H restricted to the rows and columns indexed by the vertices and edges of G' respectively, which can be obtained from H by deleting the rows and columns other than those corresponding to the vertices and edges of G' respectively. Herein, $H_{G'}$ is referred to as the sub-matrix of H associated with G'. In some embodiments, two sub-matrices of H are associated with an edge and a cycle of the graph G. For each edge, the sub-matrix may be represented as:

$$\tilde{h}^e = \begin{bmatrix} \alpha \\ \beta \end{bmatrix} \quad (9)$$

where α and β correspond to those two nonzero entries of the column of H indexed by this edge. For a length-k cycle C that consists of k consecutive edges $e_1, e_2, \ldots, e_k$, a k×k matrix may be defined as:

$$\tilde{H}^c = \begin{bmatrix} \alpha_1 & 0 & 0 & \ldots & \beta_k \\ \beta_1 & \alpha_2 & 0 & \ldots & 0 \\ 0 & \beta_2 & \alpha_3 & \ldots & 0 \\ \vdots & \vdots & \ddots & \ddots & \vdots \\ 0 & \ldots & 0 & \beta_{k-1} & \alpha_k \end{bmatrix}, \quad (10)$$

where $\alpha_i$s and $\beta_i$s correspond to those two nonzero entries of the column of H indexed by edge $e_i$. For two matrices $H_1$ and $H_2$, if $H_1$ can be transformed into $H_2$ simply through row and column permutations, then $H_1$ may be deemed equivalent to $H_2$ and the relationship denoted as $H_1 \cong H_2$.

Theorem 1

Considering the foregoing, a first theorem may be expressed as:

For a cycle GF(q) code, if its associated graph G is d-regular with d=2r, its parity check matrix H of size m×n has the equivalent form $$H \cong [\bar{H}_1, P_2 \bar{H}_2, \ldots, P_r \bar{H}_r], \quad (11)$$

where $P_i$ is m×m permutation matrix, and $\bar{H}_i$ is of size m×m, $1 \leq i \leq r$. The matrix $\bar{H}_i$ has an equivalent block-diagonal form $$\bar{H}_i \cong \mathrm{diag}(\tilde{H}_{i,1}^c, \tilde{H}_{i,2}^c, \ldots, \tilde{H}_{i,L_i}^c), \quad (12)$$

where the matrix $\tilde{H}_{i,1}^c$ has the form of the expression enumerated as (10) above and is of size $k_{i,l} \times k_{i,l}$ that satisfies $$m = \sum_{l=1}^{L_i} k_{i,l}.$$

Proof of Theorem 1

A proof of the first theorem is as follows. If G is d-regular with d=2r, r>0, G is 2-factorable. See, e.g., D. Reinhard, Graph Theory, 2nd edition, Springer-Verlag, 2000. The r edge-disjoint 2-factors of G can be denoted by $G_1, G_2, \ldots, G_r$. The columns of H can be arranged in such a pattern that the columns indexed by the edges of $G_1$ are placed in the first m columns, followed by the m columns indexed by the edges of $G_2$ until the m columns which are indexed by the edges of $G_r$. In this way, H is partitioned to r sub-matrices of size m×m each, arranged as $H \cong [H_{G1}, \ldots, H_{Gr}]$, where $H_{Gi}$ is the sub-matrix of H associated with $G_i$.

It can also be shown that each m×m sub-matrix $H_{Gi}$ has an equivalent block diagonal form as in the expression enumerated as (12) above. Each 2-factor $G_i$ can be decomposed into a set of disjoint cycles. It can be assumed that $G_i$ consists of $L_i$ disjoint cycles $C_{i,l}$, $1 \leq l \leq L_i$, where $C_{i,l}$ is of length $k_{i,l}$ that satisfies $$m = \sum_{l=1}^{L_i} k_{i,l}.$$

The rows and columns of $H_{Gi}$ can be arranged in sequence of rows and columns indexed by $C_{i,1}, C_{i,2}, \ldots, C_{i,Li}$, where the resultant matrix will have a block-diagonal form $\mathrm{diag}(\tilde{H}_{i,1}^c, \tilde{H}_{i,2}, \ldots, \tilde{H}_{i,Li}^c)$, where $\tilde{H}_{i,l}^c$ represents the matrix associated with $C_{i,l}$ and has a form as in the expression enumerated as (11) above. Thus, it can be said that $H_{Gi} = P_i \bar{H}_i R_i$, where $\bar{H}_i$ is defined in the expression enumerated as (12) above, and $P_i$ and $R_i$ are permutation matrices, $1 \leq i \leq r$.

Therefore, the matrix H can be arranged to have an equivalent form $[P_1 \bar{H}_1 R_1, P_2 \bar{H}_2 R_2, \ldots, P_r \bar{H}_r R_r]$, and further permute the rows of H to let $P_1$ be the identity matrix and permute the columns of $H_{G_i}$ to let each $R_i$ be the identity matrix. Thus, the resultant matrix would have a form like the expression enumerated as (11) above. This completes the proof.

Theorem 2

Considering the foregoing, a second theorem may be expressed as:

Consider a regular cycle GF(q) code with d=2r+1. If its associated graph G contains at least one 1-factor, then its parity check matrix H of size m×n has the equivalent form $$H \cong [\overline{H}_1, P_2 \overline{H}_2, \ldots, P_r \overline{H}_r, P^e \overline{H}^e] \quad (13a)$$

where $P_i$s and $P^e$ are permutation matrices, $\overline{H}^e$ is an m×m block-diagonal matrix having the form as in the expression enumerated as (12) above, i=1, . . . , r, $\overline{H}^e$ is an m×m/2 matrix having an equivalent block-diagonal form as $$\overline{H}^e \cong \text{diag}(\tilde{h}_1^e, \tilde{h}_2^e, \ldots, \tilde{h}_{\frac{m}{2}}^e), \quad (13b)$$

where $\tilde{h}_i^e$ is a vector having the form as in the expression enumerated as (9) above.

Proof of Theorem 2

A proof of the second theorem is as follows. If G is d-regular with d=2r+1, r>0 and G has a 1-factor M, G' can denote the graph obtained from G by deleting the edges in M. Thus, G' is 2r-regular. The columns of H can be arranged in such a pattern that the columns indexed by the edges of G' are placed in the first rm columns, followed by the m/2 columns which are indexed by the edges of M. Therefore, arranged H can be expressed as H≅[$H_{G'}$, $H_M$], where $H_{G'}$ is the sub-matrix of H associated with G' and $H_M$ is the sub-matrix of H associated with M.

Applying Theorem 1, the sub-matrix $H_{G'}$ has a form as shown in the expression enumerated as (11) above. The form of sub-matrix $H_M$ can then be shown. Since M is a 1-factor of G, M is a union of disjoint edges. The edges of M may then be denoted by $E_i$, 1≤i≤m/2. The rows and columns of $H_M$ can be arranged in sequence of rows and columns indexed by $E_1, E_2, \ldots, E_{m/2}$, and the resultant matrix will have the form as shown in the expression enumerated as (13b) above. Thus, $H_M = P^e \overline{H}^e R^e$, where $\overline{H}^e$ is defined in the expression enumerated as (13b) above, and $P^e$ and $R^e$ are permutation matrices.

Therefore, the matrix H would have an equivalent form like $[H_1, P_2 H_2, \ldots, P_r H_r P^e \overline{H}^e R^e]$ where $P^e$, $R^e$ and $P_i$s, 2≤i≤r, are permutation matrices. Furthermore, we may permute the columns of $H_M$ to let $R^e$ be the identity matrix. The resultant matrix would thus have a form like the expression enumerated as (13a) above. This completes the proof.

Summary of Theorems and Proofs

To summarize, the disclosed theorems and proofs of the exemplary embodiments have the following results for a regular cycle GF(q) code with associated graph G.

1. If G is d-regular with d=2r, r>0, Theorem 1 can be applied.
2. If G is d-regular with d=2r+1, r>0, and G has at least one 1-factor, Theorem 2 can be applied.

B. Nonbinary Irregular LDPC Code

Cycle codes over large Galois fields (e.g., q≧64) can achieve near-Shannon-limit performance. However, the performance gain brought by using LDPC cycle codes over large Galois fields significantly increases the decoding complexity—thereby mitigating the benefits. LDPC codes over small to moderate Galois fields (e.g., 4≦q≦32) may be attractive from a decoding complexity point of view. Again however, a high error floor for cycle codes over GF(q) with moderate q has been observed. The high error floor may be caused, at least in part, by undetected errors due to the codes' poor distance spectrum. In fact, cycle codes over small to moderate Galois fields (e.g., between 4 and 32) suffer from performance loss due to a "tail" in the low weight regime of the distance spectrum. See, e.g., X.-Y. Hu and E. Eleftheriou, "Binary representation of cycle tanner graph GF(2b) codes," *Proc. International Conference on Communications*, vol. 27, no. 1, pp. 528-532, June 2004. In order to lower the error floor of cycle codes, exemplary embodiments of the disclosed apparatus, systems and method employ irregular codes that are designed to increase the code's performance for high SNR. These exemplary irregular codes have an irregular column weight distribution by replacing a portion of columns of weight 2 of H by columns of weight t>2, (e.g., t=3 or t=4). This strategy can (1) increase the minimum Hamming distance of the code, (2) decrease the multiplicities of low weight codewords and/or (3) may improve the code performance at the waterfall region due to irregular column degree distribution. In some embodiments, H has $n_1$ columns having weight 2 and $n_2$ columns having weight t. The mean column weight may be expressed as:

$$\eta = \frac{2n_1 + tn_2}{n} = 2 + (t-2)\frac{n_2}{n}. \quad (14a)$$

In order to achieve linear-time encodability (as discussed in Section 3 below), $n_1$ can be restricted to be greater than or equal to m, that is, 0≦$n_2$≦(n−m). Therefore, it can be said that 2≦η≦2+(t−2)r where r=(n−m)/n, and $$n_1 = n\frac{(t-\eta)}{t-2}, \quad n_2 = \frac{n(\eta-2)}{t-2}. \quad (14b)$$

The matrix H may be arranged as $$H = [H_1 | H_2], \quad (15)$$

where $H_1$ contains all weight 2 columns and $H_2$ contains all weight t columns. Of note, $H_1$ is of size m×$n_1$ and $H_2$ is of size m×$n_2$.

3. Properties of the Proposed Nonbinary LDPC Codes

Based on the structures presented in Section 2 above, the embodiments of the present disclosure which use the disclosed irregular and regular LDPC codes may have several appealing properties of normal regular cycle GF(q) codes on the encoding, decoding, and storage requirements aspects.

A. Linear-Time Encoding in Parallel

The representation in Theorems 1 and 2 enable efficient encoding as follows. For d=2r, the codeword x can be partitioned into r sub-codewords of size m as x=[$x_{c,1}^T, x_{c,2}^T, \ldots, x_{c,r}^T$]$^T$. For d=2r+1, the codeword x can be portioned into r+1 sub-codewords as x=[$x_{c,1}^T, x_{c,2}^T, \ldots, x_{c,r}^T, x_e^T$]$^T$, where $x_{c,i}$ is one of size m, 1≦i≦r, and xe is of size m/2. Without loss of generality, it can be assumed that $\overline{H}_1$ is full rank and $x_{c,1}$ contains the parity symbols and the rest of x contain information symbols, which leads to a code rate of (d−2)/d. Therefore, a valid codeword satisfies Hx=0, which implies that $$\overline{H}_1 x_{c,1} = \begin{cases} -P_2^c \overline{H}_2 x_{c,2} - \ldots - P_r^c \overline{H}_r x_{c,r}, & d = 2r \\ -P_2^c \overline{H}_2 x_{c,2} - \ldots - P_r^c \overline{H}_r x_{c,r} - P^e \overline{H}^e x_e, & d = 2r+1 \end{cases} \quad (16)$$

From the equation enumerated as (12) above, the matrix $\tilde{H}_1$ is a block diagonal diag $(\tilde{H}_{1,1}{}^c, \ldots, \tilde{H}_{1,L_1}{}^c)$. According to the sizes of $\{\tilde{H}_{1,l}{}^c\}_{l=1}^{L_1}$, $x_{c,1}$ can be partitioned and the right hand side of the equation enumerated as (16) above into $L_1$ pieces as $[b_T^1, \ldots, b_{L_1}^T]^T$, respectively. Thus, computation of $x_{c,1}$ requires solving the following $L_1$ equations $$\tilde{H}_{1,i}{}^c x_{c,1,i} = b_i, \quad 1 \leq i \leq L_1. \tag{17}$$

A linear time algorithm for solving these equations can be applied. See, e.g., J. Huang and J.-K. Zhu, "Linear time encoding of cycle $GF(2^p)$ codes through graph analysis," *IEEE Commun. Lett.*, vol. 10, pp. 369-371, May 2006. Specifically, to solve an equation in the form of $\tilde{H}^c x = b$, where $x = [x_1, x_2, \ldots, x_k]^T$, $b = [b_1, b_2, \ldots, b_k]T$, and $\tilde{H}^c$ has the structure in the expression enumerated as (10) above, the following algorithm may be used.

1. $z_1 = b_1;\ z_i = \gamma_{i-1} z_{i-1} + b_i, i = 2, 3, \ldots, k;$ $y_k = (1 + \gamma_1 \gamma_2 \cdots \gamma_k)^{-1} z_k;$ 2. $y_i = z_i - \gamma_1 \gamma_2 \cdots \gamma_{i-1} \gamma_k y_k, i = 1, 2, \ldots, k-1;$ 3. $x_i = \alpha_i^{-1} y_i, i = 1, 2, \ldots, k.$ where $\gamma_i = \alpha_i^{-1} \beta_i$, $i = 1, 2, \ldots, k$.

It can be assumed that the coefficients have been stored before computing. The computation complexity may then be $2(k-1)$ additions, $2(k-1)$ multiplications, and $k+1$ divisions over $GF(q)$.

It is noted that solving these $L_1$ equations can be performed in parallel, thus encoding of exemplary embodiments can be performed in parallel in linear time. This provides flexibility in the implementation of efficient encoders, and is especially desirable when the codeword length is large. It is also noted that the universal linear-time encoding algorithm of for cycle codes works only in a serial manner. Fast and parallel encoding is quite desirable especially when the block length is large, or, when multiple rounds of encoding is needed for the proposed OFDM PAPR reduction, as will be detailed in section 5.

B. Reduction on the Storage Requirement

In prior embodiments, the storage cost for H contains two parts. One part corresponds to the nonzero entries of H and the other part corresponds to the structural information for H denoted as the structural storage cost. Compared with general cycle GF(q) codes which do not have the structures presented in Section 2, the structural storage cost for regular cycle GF(q) codes can be greatly reduced. To perform sum-product decoding for a general cycle GF(q) code, $2n(\lceil \log m \rceil + \lceil \log n \rceil)$ bits are needed to store the row and column indices for the $2n$ nonzero entries, where log is a base-2 logarithm operation, $\lceil x \rceil$ is the minimum integer no less than x, $\lceil \log m \rceil$ and $\lceil \log n \rceil$ bits are used to store the row and column index for each nonzero entry of H respectively. See, e.g., M. C. Davey and D. Mackay, "Low-density parity-check codes over GF(q)," *IEEE Commun. Lett.*, vol. 2, pp. 165-167, June 1999. Whereas, for a regular cycle GF(q) code which has a structure as in the expression enumerated as (11) or (13a) above, not more than $2n \lceil \log m \rceil$ bits are needed to store the interleavers and their inverses corresponding to matrices $P_i^c$s and $P_e$, where $\lceil \log m \rceil$ bits are used to store an element for interleavers and their inverses. The storage cost for the parameters $k_{i,1}$, $1 \leq l \leq L_i$ corresponding to matrix $\tilde{H}_i$, $1 \leq i \leq r$, is negligible. Thus, it can be seen that compared with general cycle GF(q) codes the reduction of structural storage cost for regular cycle GF(q) codes is more than 50 percent. See, e.g., J. Huang, S. Zhou, J.-K. Zhu and P. Willett, "Group-theoretic analysis of Cayley-graph-based cycle GF(2p) codes," *IEEE Trans. Commun.*, vol. 57, no. 6, pp. 1560-65, June 2009.

C. Parallel Processing in Sequential BP Decoding

Iterative decoding based on belief propagation (BP) has received significant attention recently, mostly due to its near-Shannon-limit error performance for the decoding of LDPC codes and turbo codes. See, e.g., R. G. Gallager, Low Density Parity Check Codes, Cambridge, Mass.: MIT Press, 1963; D. J. C. Mackay, "Good error-correcting codes based on very sparse matrices," *IEEE Trans. Inform. Theory*, vol. 45, no. 2, pp. 399-431, March 1999; F. R. Kschischang, B. J. Frey and H. A. Loeliger, "Factor graphs and the sum-product algorithm," *IEEE Trans. Inform. Theory*, vol. 47, pp. 498-519, February 2001; and C. Berrou and A. Glavieux, "Near-optimum error-correcting coding and decoding: Turbo-codes," *IEEE Trans. Commun.*, vol. 44, pp. 1261-1271, October 1996. Iterative decoding based on BP works on the code's Tanner-graph or factor graph in an iterative manner through exchange of soft information. See, e.g., R. M. Tanner, "A recursive approach to low complexity codes," *IEEE Trans. Inform. Theory*, vol. 27, pp. 533-547, September 1981, and F. R. Kschischang, B. J. Frey and H. A. Loeliger, "Factor graphs and the sum-product algorithm," *IEEE Trans. Inform. Theory*, vol. 47, pp. 498-519, February 2001. As for LDPC codes, there exist two kinds of processing units: variable node processing units and check (or constraint) node processing units corresponding to variable nodes and check nodes respectively, and two kinds of messages are exchanged between variable nodes and check nodes during iterations: variable-to-check messages and check-to-variable messages. See, e.g., J. T. Zhang and M. P. C. Fossorier, "Shuffled iterative decoding," *IEEE Trans. Commun.*, vol. 53, pp. 209-213, February 2005. In addition, three different updating schedules for BP decoding of LDPC codes can be employed—parallel updating, sequential updating and partially parallel updating.

Parallel Updating—In parallel updating, each iteration contains a horizontal step followed by a vertical step. At the horizontal step, all check nodes update in parallel to the output check-to-variable messages using the input variable-to-check messages. Then, at the vertical step, all variable nodes update in parallel to the output variable-to-check messages using the input check-to-variable messages. The updating schedule for standard BP is thus inherently fully parallel.

Sequential Updating—In sequential updating, a sequential version of the standard BP is proposed to speed up the convergence of BP decoding, which is denoted as shuffled BP or sequential updating schedule. See, e.g., J. T. Zhang and M. P. C. Fossorier, "Shuffled iterative decoding," *IEEE Trans. Commun.*, vol. 53, pp. 209-213, February 2005, and H. Kfir and I. Kanter, "Parallel versus sequential updating for belief propagation decoding," *Physica A: Statistical Mechanics and its Applications*, vol. 330, pp. 259-270, December 2003. The updating schedule for sequential BP is totally sequential—in each iteration, the horizontal step and vertical step processes are performed jointly, but in a column-by-column manner. It has been shown through simulations that the average number of iterations of the sequential BP algorithm can be about half that of the parallel BP algorithm, where parallel BP and sequential BP decoding achieve similar error performance. See, e.g., J. T. Zhang and M. P. C. Fossorier, "Shuffled iterative decoding," *IEEE Trans. Commun.*, vol. 53, pp. 209-213, February 2005; H. Kfir and I. Kanter, "Parallel versus sequential updating for belief propagation decoding," *Physica A: Statistical Mechanics and its Applications*, vol. 330, pp. 259-270, December 2003; and J. T. Zhang and M. P. C. Fossorier, "Shuffled belief propagation decoding," in *Proceedings of the 36th Asilomar Conference on Signals, Systems and Comput-*

*ers*, vol. 1, pp. 8-15, November 2002. The complexity per iteration for both the sequential and parallel algorithms is similar, resulting in a lower total complexity for the sequential BP algorithm. See, e.g., J. T. Zhang and M. P. C. Fossorier, "Shuffled iterative decoding," *IEEE Trans. Commun.*, vol. 53, pp. 209-213, February 2005; and H. Kfir and I. Kanter, "Parallel versus sequential updating for belief propagation decoding," *Physica A: Statistical Mechanics and its Applications*, vol. 330, pp. 259-270, December 2003.

Partially Parallel Updating—In partially parallel updating, in order to decrease the decoding delay of the sequential BP and preserve the parallelism advantages of the parallel BP, a partially parallel decoding scheme named "group shuffled BP" is developed. See, e.g., J. T. Zhang and M. P. C. Fossorier, "Shuffled iterative decoding," *IEEE Trans. Commun.*, vol. 53, pp. 209-213, February 2005. In the group shuffled BP algorithm, the columns of H are divided into a number of groups. In each group, the updating of messages is processed in parallel, but the processing of groups remains sequential. When the number of groups is one, group shuffled BP reduces to the parallel BP algorithm. But if the number of groups equals the number of columns of H, group shuffled BP reduces to the sequential BP algorithm. Thus, one can conclude that the group shuffled BP (partially parallel BP) algorithm offers better throughput/complexity tradeoffs in the implementation of efficient decoders.

With respect to the sequential BP algorithm, if there are consecutive columns of H which are orthogonal to each other (i.e., no two columns intersect at a common row), then the updating for these columns can be carried out simultaneously. By performing updating for consecutive orthogonal columns simultaneously, the throughput of sequential BP algorithm can be improved without any penalty in error performance or total decoding complexity. This algorithm is denoted as sequential BP decoding with parallel processing. Sequential BP decoding with parallel processing is hence analogous in principle to a partially parallel BP algorithm where the columns in each group are orthogonal.

For a cycle GF(q) code, a collection of columns of H are orthogonal if and only if their corresponding edges in its associated graph G are independent. With the structures presented in Section 2, orthogonal columns for regular cycle GF(q) codes can be easily located. Of note:

The columns of H corresponding to edges of a 1-factor of G are orthogonal.

If every component of a 2-factor is an even cycle, it is defined as an even 2-factor. Further, if a 2-factor is even, its edges can be partitioned into two orthogonal groups. For example, the 2-factor illustrated in FIG. 3 is even, which contains one length-2 cycle $C_1=v_2e_8v_3e_{11}v_2$ and one length-4 cycle $C_2=v_1e_7v_4e_3v_5e_9v_6e_4v_1$. The edges of the 2-factor illustrated in FIG. 3 can therefore be partitioned into two orthogonal groups $\{e_8, e_7, e_9\}$ and $\{e_1, e_3, e_4\}$, as illustrated in FIGS. 4a and 4b.

Figure 7A:
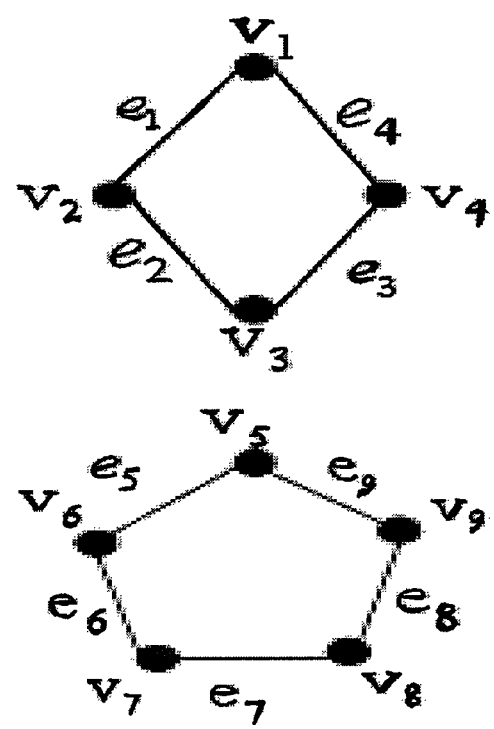
FIG. 7a depicts an exemplary uneven 2-factor graph which contains one length-4 cycle $C_1=v_1e_1v_2e_2v_3e_3v_4e_4v_1$ and one length-5 cycle $C_2=v_5e_5v_6e_6v_7e_7v_8e_8v_9e_9v_5$.
Figure 7B:
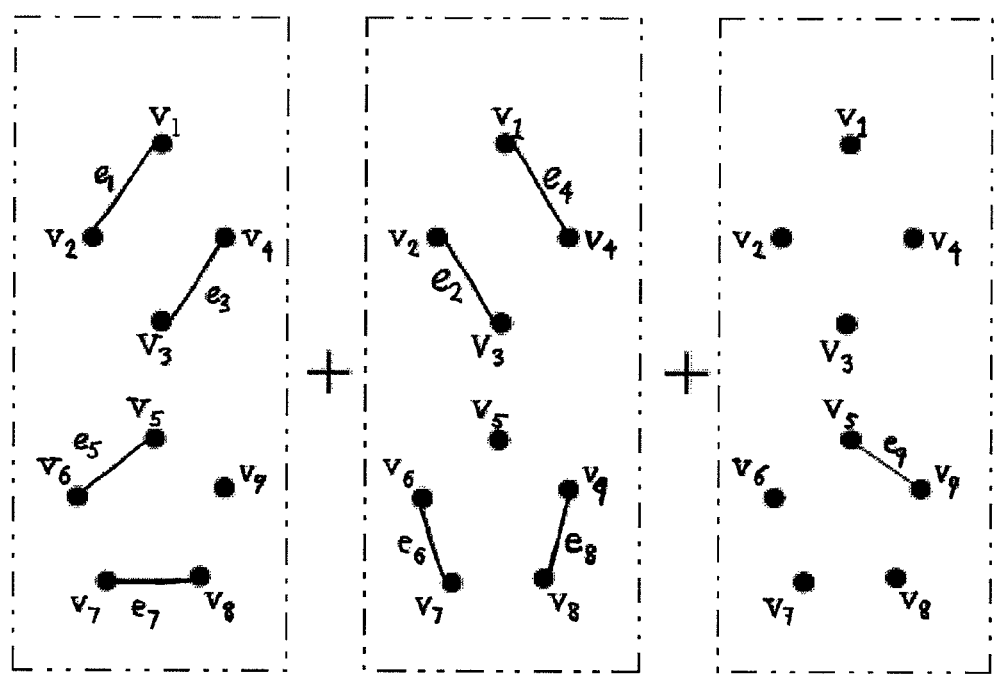
FIG. 7b depicts the 2-factor graph of FIG. 7a partitioned into three orthogonal groups $\{e_1,e_3,e_5,e_7\}$, $\{e_2,e_4,e_6,e_8\}$ and $\{e_9\}$.

If a 2-factor is not even, its edges can be partitioned into three orthogonal groups. For example, as for the 2-factor illustrated in FIG. 7(a), which contains one length-4 cycle $C_1=v_1e_1v_2e_2v_3e_3v_4e_4v_1$ and one length-5 cycle $C_2=v_5e_5v_6e_6v_7e_7v_8e_8v_9e_9v_5$, its edges can be partitioned into three orthogonal groups $\{e_1, e_3, e_5, e_7\}, \{e_2, e_4, e_6, e_8\}$ and $\{e_9\}$ as illustrated in FIG. 7(b).

Based on the aforementioned facts, the following results for d-regular cycle GF(q) codes can be summarized.

1) For a d-regular graph G with d=2r, it has r edge-disjoint 2-factors; if the number of even 2-factors is t, then edges of G can be partitioned into $3r-t=3/2d-t$ orthogonal groups, $0 \leq t \leq d/2$.

2) For a d-regular graph G with d=2r+1, if it contains at least one 1-factor, then it can be decomposed into r+1 edge-disjoint components which consist of one 1-factor and r 2-factors; denote the number of even 2-factors as t, then the edges of G can be partitioned into $3r-t+1=3/2d-t-1/2$ orthogonal groups, $0 \leq t \leq (d-1)/2$.

3) If the d-regular graph G is 1-factorable, then its edges can be partitioned into d orthogonal groups.

Compared with sequential BP decoding, which works in a column-by-column manner and takes n steps, by running updating for columns in each orthogonal group simultaneously, throughput of sequential BP decoding algorithm for regular cycle GF(q) codes can be improved by a factor at least 2n/3d. It is noted that n is usually large while d is usually small. The resulting large throughput improvement may be appealing in the implementation of efficient decoders. It is also noted that the performance and complexity advantages of sequential BP decoding are not compromised by this approach.

4. The Design of the Proposed Nonbinary LDPC Codes

A. Nonbinary Regular Cycle Code

In Section 2 above, the preferred structure of the parity check matrix for regular cycle GF(q) codes was disclosed. Now, the preferred design philosophy of regular cycle GF(q) codes is disclosed. In the preferred embodiments, a two step process to design regular cycle GF(q) codes is used. First, the code structure that specifies the locations of nonzero entries in the check matrix is designed. The code structure is reflected by an associated graph, which is desired to have properties known to be advantageous—such as large girth, small diameter and good expansion property. See, e.g., J. Rosenthal and P. O. Vontobel, "Constructions of LDPC codes using Ramanujan Graphs and ideals from Margulis," in *Proceedings of the 38th Annual Allerton Conference on Communication, Control, and Computing*, pp. 248-257, 2000; and M. Ipser and D. A. Spielman, "Expander codes," *IEEE Trans. Inform. Theory*, vol. 42, pp. 1710-1722, November 1996. Then, in the second step, the nonzero entries of the parity check matrix are determined.

I. Structure Design of the Check Matrix

In exemplary embodiments of the present disclosure, at least three main methods to find a regular associated graph with advantageous properties may be used: (1) adoption of regular graphs with good properties, such as the Ramanujan graphs; (2) a computer search algorithm, for example, using a modified version of the progressive edge-growth (PEG) algorithm; and (3) utilize the structure results presented in Section 2 above to construct regular associated graphs through carefully designing interleavers. See, e.g., X. Y. Hu, E. Eleftheriou and D.-M. Arnold, "Regular and irregular progressive edge-growth Tanner graphs," *IEEE Trans. on Inform. Theory*, vol. 51, January 2005; and, G. Davidoff, P. Sarnak and A. Valette, *Elementary Number Theory, Group Theory, and Ramanujan Graphs*, Cambridge University Press, 2002.

Method 1: Code Structure Design Based on Regular Graphs.

In some embodiments, good regular graphs are used to design the code structure, for example, the Ramanujan graphs. See, e.g., G. Davidoff, P. Sarnak and A. Valette, *Elementary Number Theory, Group Theory, and Ramanujan Graphs*, Cambridge University Press, 2002. A d-regular Ramanujan graph is defined by the property that the second largest eigen-value of its adjacency matrix is no greater than $2\sqrt{d-1}$ and thus is known to have good expansion properties, large girth and small diameter. In particular, the girth of Ramanujan graphs is asymptotically a factor of 4/3 better than the Erdos-Sachs bound, which in terms of girth appears to be the best d-regular graphs known.

Good known graphs may be limited in the number of code choices. Given a d-regular graph G with m vertices and girth g, if it contains at least one 1-factor M (one 2-factor $G_1$, respectively), a d–1-regular (d–2-regular, respectively) graph G' from G can be obtained by deleting the edges of M ($G_1$, respectively) from G. The resultant graph G' may be a d–1-regular (d–2-regular, respectively) graph with m vertices and girth no less than g. Utilizing G' as the associated graph, one can construct a check matrix with fixed row weight d–1 (d–2, respectively).

Method 2: Code Structure Design Based on Computer Search.

Computer search based algorithms have been adopted to construct LDPC codes. Among them, the progressive edge-growth (PEG) algorithm has been shown to be efficient and feasible for constructing LDPC codes with short code lengths and high rates as well as LDPC codes with long code lengths. The PEG algorithm constructs Tanner graphs having a large girth in a best effort sense by progressively establishing edges between symbol and check nodes in an edge-by-edge manner. Given the number of symbol nodes, the number of check nodes and the symbol-node-degree sequence of the graph, an edge-selection procedure is started such that the placement of a new edge on the graph has as small impact on the girth as possible. After a best effort edge has been determined, the graph with this new edge is updated, and the procedure continues with the placement of the next edge. Compared with other existing constructions, the predominant advantage of PEG algorithm is that it successfully generates good LDPC codes for any given block length and any rate. The PEG algorithm can also be adopted to construct regular LDPC codes which have fixed row weight and fixed column weight. See, e.g., X. Y. Hu, E. Eleftheriou and D. M. Arnold, "Regular and irregular progressive edge-growth Tanner graphs," *IEEE Trans. on Inform. Theory*, vol. 51, January 2005.

It is important to note that the PEG algorithm constructs Tanner graphs with large girth. Further, with a slight modification the PEG algorithm can be adopted to construct associated graphs with large girth for cycle GF(q) codes, including irregular, regular and bipartite regular cycle GF(q) codes. Based on this observation, some embodiments of the present disclosure utilize a modified PEG algorithm to construct three kinds of regular cycle GF(q) codes.

In exemplary embodiments, given parameters n, m, d with dm=2n, a d-regular associated graph G with m vertices and n edges can be constructed.

1) If d=2r in the embodiment, the modified PEG algorithm can be applied to obtain a 2r-regular graph G. With the graph G a regular cycle GF(q) code with degree 2r can be constructed.

2) If d=2r+1 (m must be even), m/2 disjoint edges in G which correspond to a 1-factor of G should be first established. Then, the modified PEG algorithm can be applied to obtain a 2r+1-regular graph G. With the graph G, a regular cycle GF(q) code with degree 2r+1 can be constructed.

3) If m=2m1, the modified PEG algorithm may be applied to obtain a d-regular bipartite graph G. With the graph G, a d-regular bipartite cycle GF(q) code can be constructed.

Method 3: Code Structure Design Based on the Equivalent Form of the Check Matrix.

In another exemplary embodiment, the structure results presented in section 2 may be used as the methodology for constructing regular cycle GF(q) codes. Theorems 1 and 2 above can be used construct regular cycle GF(q) codes. For example, given the parameters n, m, d with dm=2n, a parity check matrix H with fixed row weight d and column weight 2 can be constructed.

1) If d=2r, Theorem 1 may be applied to construct a matrix H having the form in the expression enumerated as (11) above by carefully designing the interleavers corresponding to permutation matrices $P_i$s and appropriately choosing the quantity $k_{i,l}$, $1 \leq i \leq r$, $1 \leq l \leq L_i$.

2) If d=2r+1, Theorem 2 may be applied to construct a matrix H having the form of the expression enumerated as (13a) above by carefully designing the interleavers corresponding to permutation matrices $P_i$s and $P^e$ and appropriately choosing the quantity $k_{i,l}$, $1 \leq i \leq r$, $1 \leq l \leq L_i$.

II. Determination of Nonzero Entries of the Check Matrix

The selection of the nonzero entries of H affects the code performance and therefore is an important design parameter. As a point of analysis, it is assumed that a binary extension filed, that is, $q=2^p$ for some p. However, the following results can be generalized straightforward to other Galois fields. It may be assumed that $\xi$ is a primitive element of $GF(2^p)$ satisfying $f(\xi)=0$, where $f(x)=x^p+f^{p-1}x^{p-1}+\ldots+f_0$ is a primitive polynomial of degree p over GF(2). Further, it may be assumed that $Z_{q-1}$ be the additive group modulo q–1. The mapping $$M: GF(q)\backslash\{0\} \to \mathbb{Z}_{q-1}, \xi^i \to i, i=0, 1, \ldots, q-2, \quad (18)$$

is therefore an isomorphism from the multiplicative group of GF(q) to $Z_{q-1}$.

The sub-matrix associated with a length-k cycle is equivalent to $\tilde{H}^c$ as shown in the expression enumerated as (10) above. It is known that the cycle is irresolvable if and only if $\tilde{H}^c$ is full-rank, i.e., $\Pi_{i=1}^k \alpha_i^{-1} \beta_i \neq 1$. See, e.g., J. Huang and J.-K. Zhu, "Linear time encoding of cycle GF(2p) codes through graph analysis," *IEEE Commun. Lett.*, vol. 10, pp. 369-371, May 2006. If the gain of the edge $e_i$ is defined as $\gamma_i = \alpha_i^{-1}\beta_i$, then $\tilde{H}^c$ is full-rank if and only if $\Pi_{i=1}^k \gamma_i \neq 1$, i.e., $$\sum_{i=1}^k M(\gamma_i) \neq 0 \pmod{q-1}. \quad (19)$$

It has been observed that resolvable cycles with short length correspond to low-weight codewords, which may induce undetected errors during the decoding process. See, e.g., J. Huang, S. Zhou, J.-K. Zhu and P. Willett, "Group-theoretic analysis of Cayley-graph-based cycle GF(2p) codes," *IEEE Trans. Commun.*, vol. 57, no. 6, pp. 1560-65, June 2009. To achieve good decoding performance, exemplary embodiments include codes designed with the following design criterion:

C1: choose nonzero entries of the check matrix to make as many cycles irresolvable as possible, especially those having short length.

Based on the associated graph, all the cycles can be found. Then, an appropriate $\gamma_i$ may be chosen through solving a set of inequalities (e.g., the expression enumerated as (19) above) corresponding to those cycles of short length. Given $\gamma_i$ for an edge $e_i$, the value $\alpha_i$ can be randomly generated with uniform distribution, and the value $\beta_i$ can be determined using $\beta_i = \alpha_i \gamma_i$. This exemplary algorithm applies to both regular cycle GF(q) codes and irregular cycle GF(q) codes.

B. Nonbinary Irregular LDPC Code

In exemplary embodiments, $H_1$ and $H_2$ may be designed to maximally benefit from the structure developed for regular cycle code in Section 2 above. In one embodiment, this is accomplished by noting that $H_1$ corresponds to the check matrix of a general cycle code and designing $H_1$ to be as close to a regular cycle code as possible. Specifically, the matrix may be split as $$H=[H_{1a}|H_{1b}|H_2], \quad (20)$$

where the matrix $H_{1a}$ is of size $m \times n_{1a}$ and the matrix $H_{1b}$ is of size $m \times n_{1b}$. The number $n_{1a}$ can be the largest integer not greater than $n_1$ that can render $d_{1a}=(2n_{1a})/m$ an integer—that is, $H_{1a}$ is the largest sub-matrix of $H_1$ that could be made $d_{1a}$-regular. Further, if $n_{1a}=n_1$, then $n_{1b}=0$. As such, $H_1$ itself can be made regular, which is a special case.

The detailed design steps of an exemplary design method include:

Step 1: Specify the structure of $H_{1a}$. Construct a cycle code of fixed row weight $d_{1a}$ using the design methodologies outlines above with respect to regular cycle codes. See, e.g., J. Huang, S. Zhou, and P. Willett, "Structure, Property, and Design of Nonbinary Regular Cycle Codes," *IEEE Trans. on Communications*, vol. 58, no. 4, April 2010.

Step 2: Specify the structure of $H_{1b}$ and $H_2$. Apply the progressive edge-growth (PEG) algorithm to attach $n_{1b}$ columns of weight 2 and $n_2$ columns of weight t to the matrix $H_{1a}$. See, e.g., X.-Y. Hu, E. Eleftheriou, and D.-M. Arnold, "Regular and irregular progressive edge-growth tanner graphs," *IEEE Trans. Inform. Theory*, vol. 51, no. 1, pp. 386-398, January 2005. In this way, the structure of H in the expression enumerated as (20) above is established.

Step 3: Specify the non-zero entries of $H_1$. The submatrix $H_1=[H_{1a}|H_{1b}]$ can be regarded as a check matrix of a cycle code. Hence, design criterion can be applied to choose appropriate nonzero entries for $H_1$ to make as many as possible short length cycles of the associated graph of $H_1$ irresolvable. See, e.g., J. Huang and J.-K. Zhu, "Linear time encoding of cycle GF(2p) codes through graph analysis," *IEEE Commun. Lett.*, vol. 10, pp. 369-371, May 2006.

Step 4: Specify the non-zero entries of $H_2$. The nonzero entries of $H_2$ are generated randomly with a uniform distribution over the set $GF(q)\backslash 0$.

Figure 5:
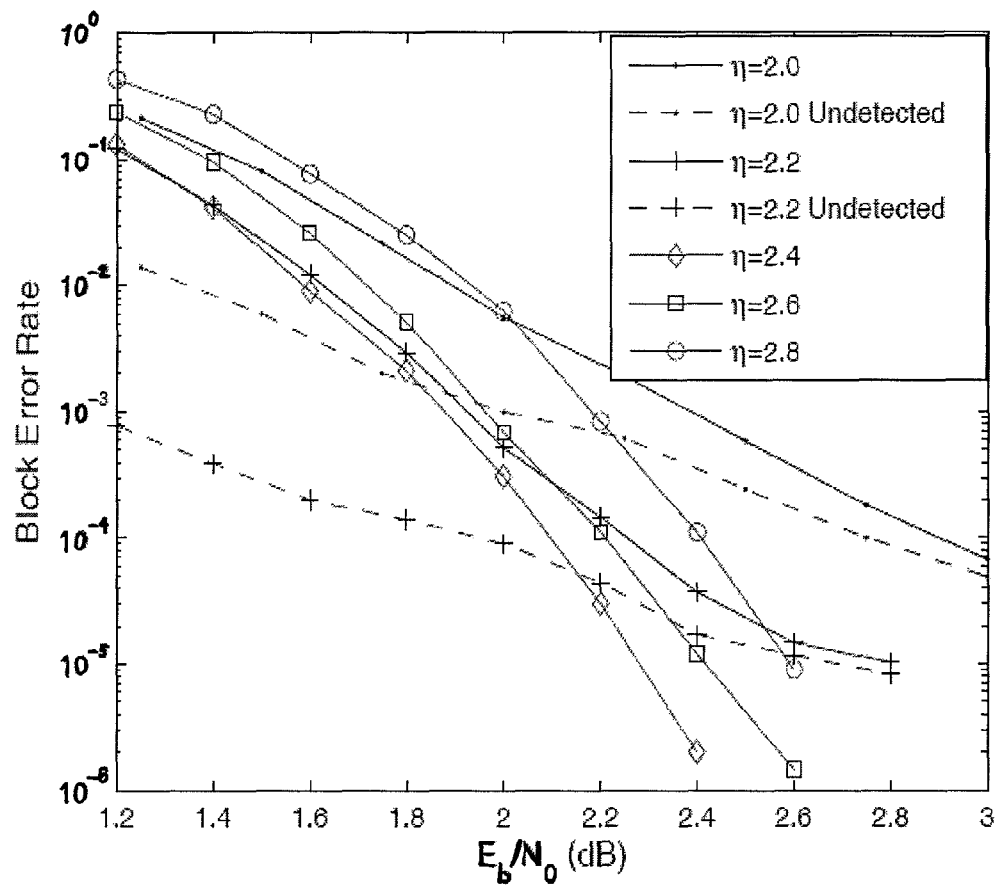
FIG. 5 illustrates a performance comparison of exemplary nonbinary irregular codes over GF(16) and mean column weights.
Figure 6:
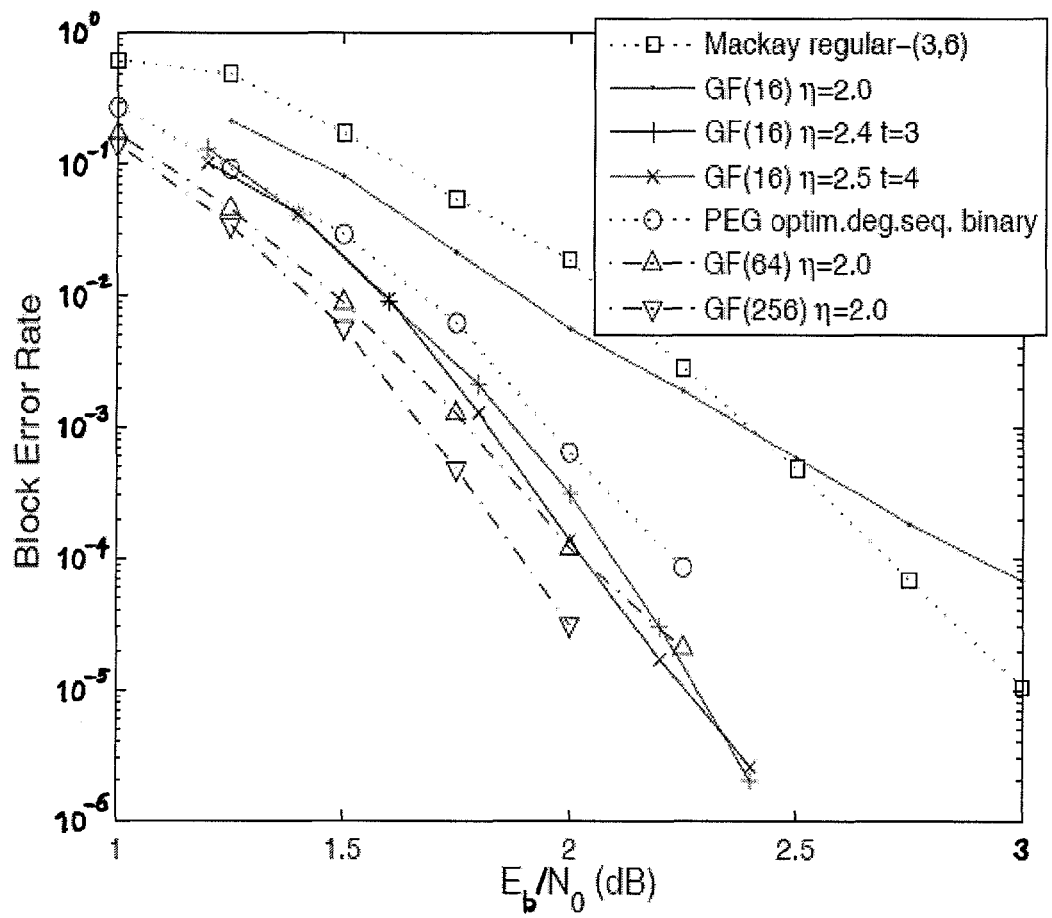
FIG. 6 illustrates a performance comparison of exemplary nonbinary irregular codes over GF(16) and exemplary binary optimized LDPC codes.

The proposed nonbinary irregular LDPC codes attempt to make a large portion of its check matrix into a regular cycle code. In this way, many benefits from regular cycle codes can be retained. FIG. 5 compares the performance of irregular LDPC codes over GF(16) with different mean column weights. All the codes have rate of ½ and block length of 1008 bits. More specifically, FIG. 5 shows a performance comparison of irregular codes over GF(16) with different mean column weights t=3, r=½, and the block length is 1008 bits, and for the η=2.0 and η=2.2 cases, the probability of undetected errors, which contributes to the error floor of the block error rate, is also plotted. BPSK modulation is used on the binary input AWGN channel and the decoder uses the sequential BP algorithm with a maximum of 80 iterations. See, e.g., H. Kfir and I. Kanter, "Parallel versus sequential updating for belief propagation decoding," *Physica A: Statistical Mechanics and its Applications*, vol. 330, pp. 259-270, December 2003; and J.-T. Zhang and M. P. C. Fossorier, "Shuffled iterative decoding," *IEEE Trans. Commun.*, vol. 53, pp. 209-213, February 2005. As can be seen from FIG. 5, it is noted that the codes with η=2.0 and η=2.2 show an error floor above $10^{-5}$ which are caused by undetected errors. No error floor above $10^{-5}$ shows if η≧2.4. Further, no undetected errors have been observed for η≧2.4 in our simulations. In reference to FIG. 5, it is further noted that as η increases from 2.4 to 2.6 and 2.8, the code performance degrades. Therefore, the code with η=2.4 may be considered the optimum one in this setting. FIG. 5 also shows the performance comparison between the irregular LDPC codes over GF(16) with binary optimized LDPC code. The performance of Mackay's (3,6)-regular code and cycle codes over GF(64) and GF(256) are also included. See, e.g., J. Huang, S. Zhou, and P. Willett, "Structure, Property, and Design of Nonbinary Regular Cycle Codes," *IEEE Trans. on Communications*, vol. 58, no. 4, April 2010. It can be further seen from FIG. 5 that by adopting an irregular column weight distribution, the code's performance has been greatly improved.

5. Peak-to-Average Power Ratio Reduction of the Proposed Nonbinary LDPC Codes

One major problem associated with OFDM is the high peak-to-average power ratio (PAPR), which can be defined as $$PAPR := \frac{\max(|x(t)|^2)}{E[|x(t)|^2]}, \quad (21)$$

where x(t) is the transmitted OFDM signal. PAPR can be evaluated at either baseband or passband, depending on the choice of x(t). See, e.g., S. Litsyn, *Peak Power Control in Multicarrier Communications*, Cambridge University Press, 2007. Nonlinear amplification may cause inter modulation among subcarriers and undesired out-of-band radiation. In theory, to limit nonlinear distortion, the amplifier at the transmitter should operate with large power back-offs.

Various PAPR reduction methods have been proposed for radio OFDM systems. See, e.g., S. Litsyn, Peak Power Control in Multicarrier Communications, Cambridge University Press, 2007. The preferred embodiments of the present disclosure utilize the selected mapping (SLM) approach. See, e.g., R. Bauml, R. Fischer, and J. Huber, "Reducing the peak-to-average power ratio of multicarrier modulation by selected mapping," *Electron. Lett.*, vol. 32, no. 22, pp. 2056-2057, October 1996; and M. Breiling, S. Muller-Weinfurtner, and J.-B. Huber, "SLM peak-power reduction without explicit side information," *IEEE Commun. Lett.*, vol. 5, no. 6, pp. 239-241, June 2001. In SLM, the transmitter generates a set of sufficiently different candidate signals which all represent the same information and selects the one with the lowest PAPR for transmission. In the original SLM approach, side information on which signal candidate has been chosen needs to be transmitted and can cause signaling overhead. In addition, side information has high importance and should be strongly protected. In the currently preferred approach, some additional bits, used to select different scrambling code patterns, are inserted into the information bits, before applying scrambling and channel encoding. In this way, the side information bits are contained in the data and do not require separate encoding.

The fact that the generator matrix G of a LDPC code has high density is well known, but rarely utilized. In some embodiments, this property of LDPC is used to reduce PAPR, following the principle of SLM. See, e.g., M. Breiling, S. Muller-Weinfurtner, and J.-B. Huber, "SLM peak-power reduction without explicit side information," *IEEE Commun. Lett.*, vol. 5, no. 6, pp. 239-241, June 2001. The transmitter can be said to operate as follows:

For each set of information bits to be transmitted within one OFDM symbol, reserve z bits for PAPR reduction purpose.

For each choice of the values of these z bits, carry out LDPC encoding and OFDM modulation, and calculate the PAPR.

Out of $2^z$ candidates, select the OFDM symbol with the lowest PAPR for transmission.

Compared with the original SLM approach, the proposed method bypasses the scrambling operation at the transmitter and the descrambling operation at the receiver. Due to the non-sparseness of G, single bit change will lead to a drastically different codeword after LDPC encoding. See, e.g., D. Mackay, Information Theory, Inference, and Learning Algorithms, Cambridge University Press, 2003. Since z is very small, the reduction on transmission rate is negligible. At the receiver side, those z bits are simply dropped after channel decoding. The main complexity increase is hence on the transmitter. Fast encoding as presented in Section 3 is thus very important for the proposed approach.

As an example, for a systematic nonbinary LDPC code with size n×k, there can be said to be a k×k identity matrix contained in G. Therefore, every information bit change can only cause significant changes on the (n−k) parity symbols. Also, for low rate transmissions, systematic LDPC may achieve decent PAPR reduction. However, for high rate transmissions where (n−k) is small, nonsystematic LDPC codes may be preferred over systematic codes for PAPR reduction.

One exemplary way to construct a nonsystematic code from a systematic code is as follows. The z reserved bits may be placed into the last s information symbols of the block u, where s=⌈z/p⌉.

A matrix V can be constructed as $$V = \begin{bmatrix} I_{k-s} & B \\ 0 & A \end{bmatrix} \quad (22)$$

where A is an invertible square matrix of size s×s and B is of size (k−s)×s. Then, the generator matrix of the nonsystematic code may be constructed from that of a systematic code as $$G_{non} = G_{sys} V. \quad (23)$$

The output codeword can then be expressed as $x = G_{non} u = G_{sys} Vu$, which means that the information block u is scrambled by the matrix V before being passed to the systematic encoder. At the decoder, an estimate of Vu may be recovered, and then û obtained by left multiplying the inverse of V as $$V^{-1} = \begin{bmatrix} I_{k-s} & -BA^{-1} \\ 0 & A^{-1} \end{bmatrix}. \quad (24)$$

It is noted that the size of A is very small. For example, if z=4, then s=2 when using an LDPC code over GF(4), and s=1 when using an LDPC code over GF(16). Therefore, left multiplication of $V^{-1}$ has low complexity and can be done in parallel.

Figure 17:
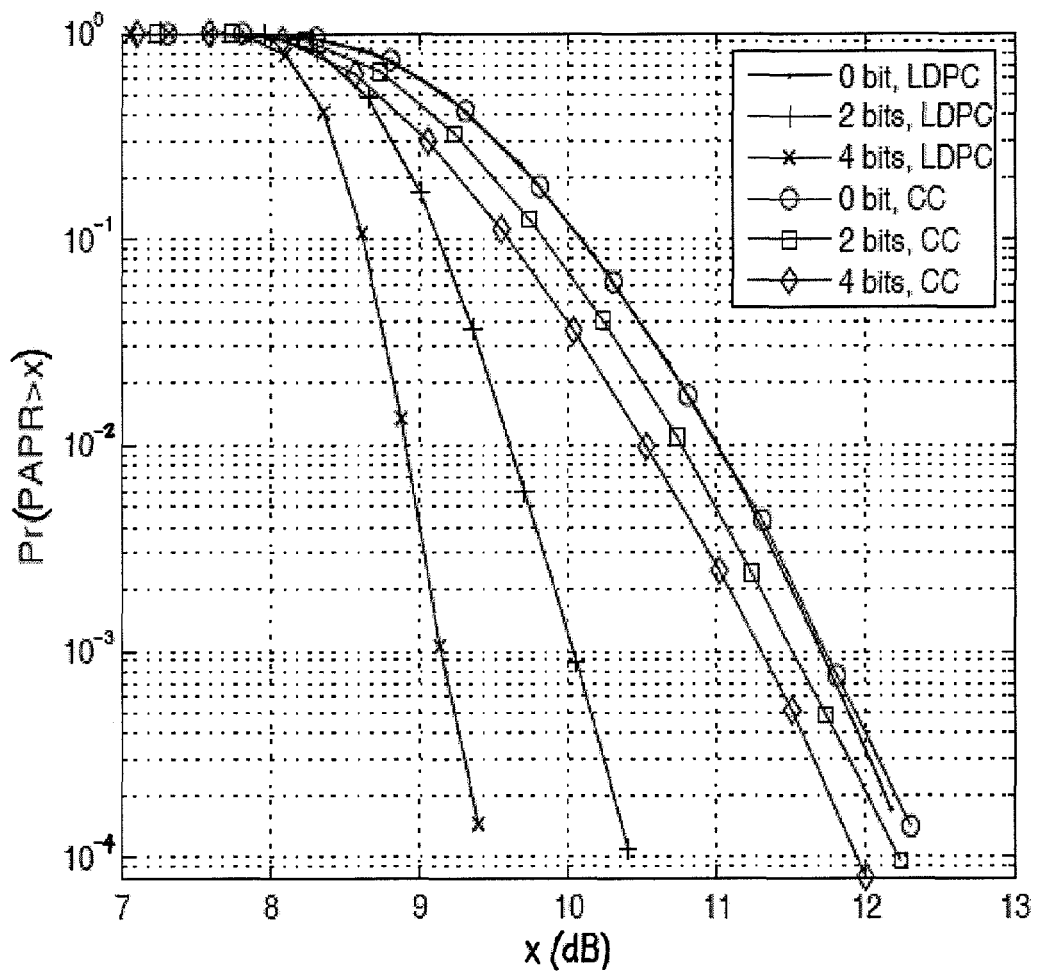
FIG. 17 depicts a comparison of PAPR reduction using exemplary LDPC and convolutional codes ("CC").
Figure 18:
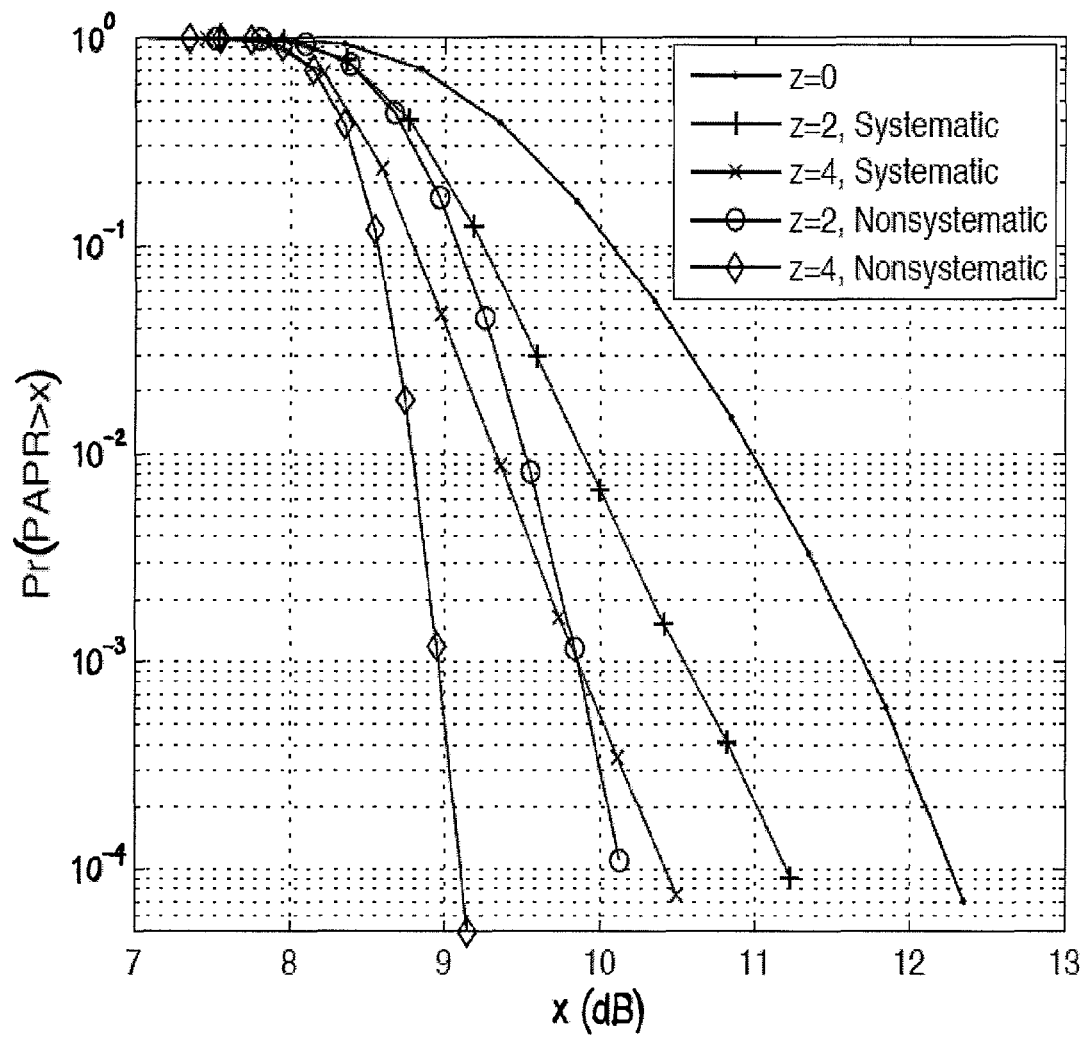
FIG. 18 depicts another comparison of PAPR reduction using exemplary LDPC and CC codes using a rate of ½ coding.

With certain OFDM parameters, and where each OFDM block has 1024 subcarriers out of which 672 subcarriers are used for data transmission, it is possible to simulate the baseband OFDM signals with a sampling rate 4 times of the bandwidth to evaluate the complementary cumulative distribution function (ccdf), Pr(PAPR>x). The PAPR ccdf curves for mode 2 of Table I are shown in FIG. 17 for z=0, z=2, and z=4, respectively, where the corresponding curves using a 64-state rate-½ convolutional code (with generators) are also included. It is noted that the generator matrix of convolutional code has low density, as each bit can only affect subsequent bits within the constraint length. For convolutional codes, the z reserved bits are distributed uniformly among the information bit sequence. It can be observed from FIG. 17 that using a nonbinary LDPC code with 4 bits overhead can achieve about 3 dB gain than the case with no overhead at the ccdf value of $10^{-3}$. Compared with convolutional codes using 4 bits overhead, nonbinary LDPC code with 4 bits overhead can achieve about 2 dB gain at the ccdf value of $10^3$. Further, scrambling can be used together with convolutional codes to improve the PAPR characteristic. See, e.g., M. Breiling, S. Muller-Weinfurtner, and J.-B. Huber, "SLM peak-power reduction without explicit side information," *IEEE Commun. Lett.*, vol. 5, no. 6, pp. 239-241, June 2001. However, scrambling is not necessary with LDPC codes. With rate 1/2, it can be seen that systematic and nonsystematic codes have similar PAPR reduction performance. In fact, FIG. 18 shows that nonsystematic LDPC codes have better PAPR reduction than systematic codes when the code rate is increased to ¾.

6. Simulation Results of the Proposed Nonbinary LDPC Codes

In this section, simulations of some embodiments were conducted to evaluate the performance of the irregular and regular LDPC GF(q) codes.

In the following simulations the codewords were transmitted over AWGN channel with binary phase-shift-keying (BPSK) modulation. Each SNR simulations were run until more than 40 block errors were observed or up to 1,000,000 block decodings.

Test Case 1 (Regular Versus Irregular Cycle GF(q) Codes)

Figure 8:
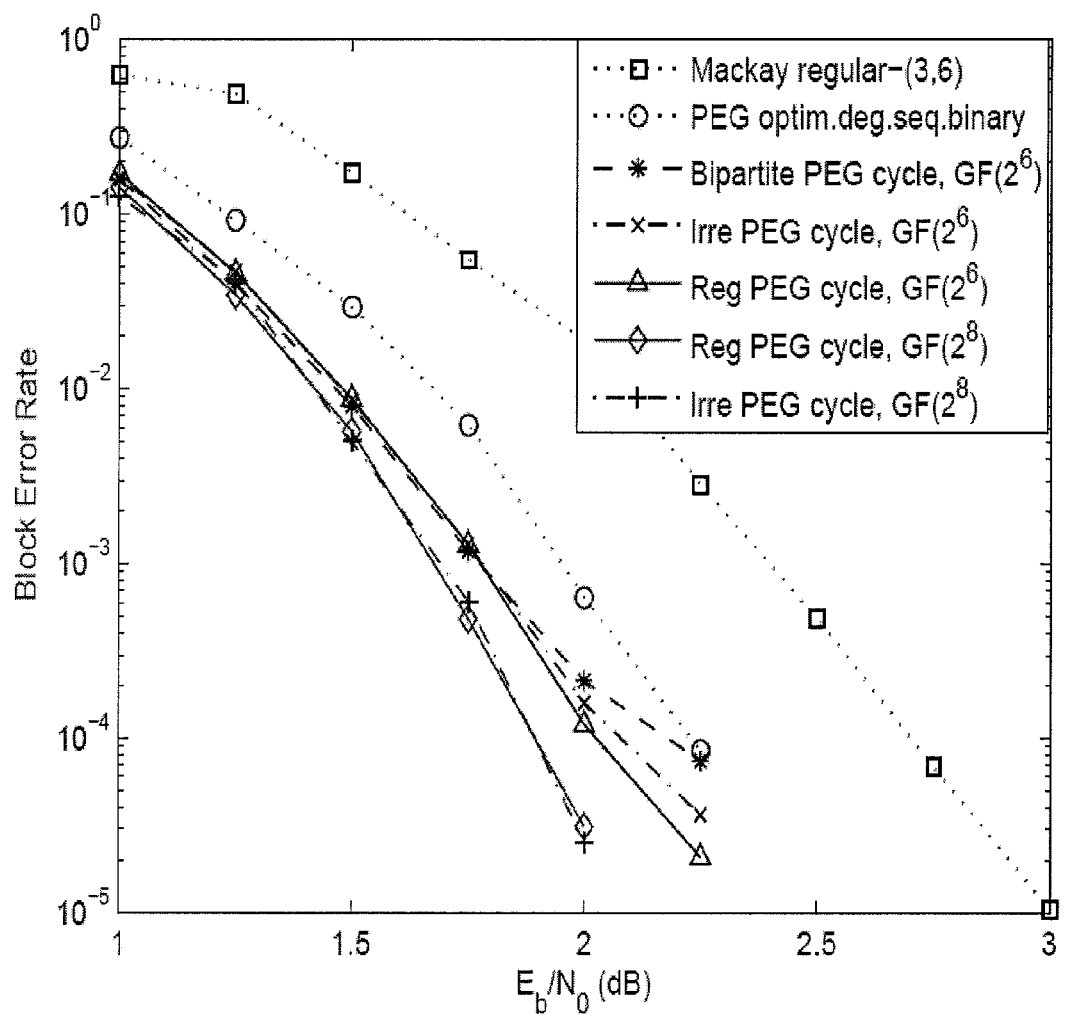
FIG. 8 depicts a performance comparison of exemplary regular, irregular and bipartite regular cycle GF(q) codes under standard belief propagation (BP) decoding up to 80 iterations where the code rate is ½ and the codeword length is 1008 bits.

FIG. 8 shows a comparison of the performance of regular and irregular cycle GF(q) codes under standard BP decoding up to 80 iterations where the code rate is ½ and the codeword length is 1008 bits. The cycle codes over $GF(2^6)$ have a symbol length of 84 and the cycle codes over $GF(2^8)$ have a symbol length of 63. For $GF(2^6)$ a bipartite regular cycle code was also constructed. The check matrices of irregular cycle GF(q) codes were constructed by the PEG algorithm. The check matrices of regular and bipartite regular cycle GF(q) codes were also constructed by the modified PEG algorithm described in Section 4. Nonzero entries of the check matrices for all cycle GF(q) codes are randomly generated with a uniform distribution. Also plotted is the performance of a binary irregular rate-½ LDPC code constructed by the PEG algorithm and that of a rate-½ MacKay's regular-(3,6) code, both having a code length of 1008 bits and decoded by standard BP up to 80 iterations. The binary irregular code has a density-evolution-optimized degree distribution pair achieving an impressive iterative decoding threshold of 0.3347 dB, i.e. the symbol-node edge distribution is $0.23802x + 0.20997x^2 + 0.03492x^3 + 0.12015x^4 + 0.01587x^6 + 0.00480x^{13} + 0.37627x^{14}$ and the check-node edge distribution is $0.98013x^7 + 0.01987x^8$. See, Table II in T. Richardson, A. Shokrollahi and R. Urbanke, "Design of provably good low-density parity-check codes," *IEEE Trans. Inform. Theory*, vol. 47, pp. 619-637, February 2001.

It has been shown that irregular cycle codes over GF(q) can outperform binary degree-distribution-optimized LDPC codes. See, e.g., X.-Y. Hu and E. Eleftheriou, "Binary representation of cycle Tanner-graph GF(2b) codes," *IEEE International Conference on Communications*, vol. 27, no. 1, pp. 528-532, June 2004. As shown in FIG. 8, it is noted that the regular cycle codes can also outperform binary degree-distribution optimized LDPC codes. In fact, FIG. 8 shows that regular cycle codes and irregular cycle codes have similar performance. Of note, the error floor appears earlier for the bipartite-graph based cycle code over $GF(2^6)$ than the regular and irregular cycle codes over $GF(2^6)$, which may be due to a large portion of undetected errors of weight 6 corresponding to length-6 resolvable cycles in its associated graph. In some embodiments, this error floor can be effectively lowered by careful selection of non-zero entries in the check matrix, as will be elaborated in Test Case 3.

Test Case 2 (Sequential Versus Parallel BP Decoding)

Figure 9:
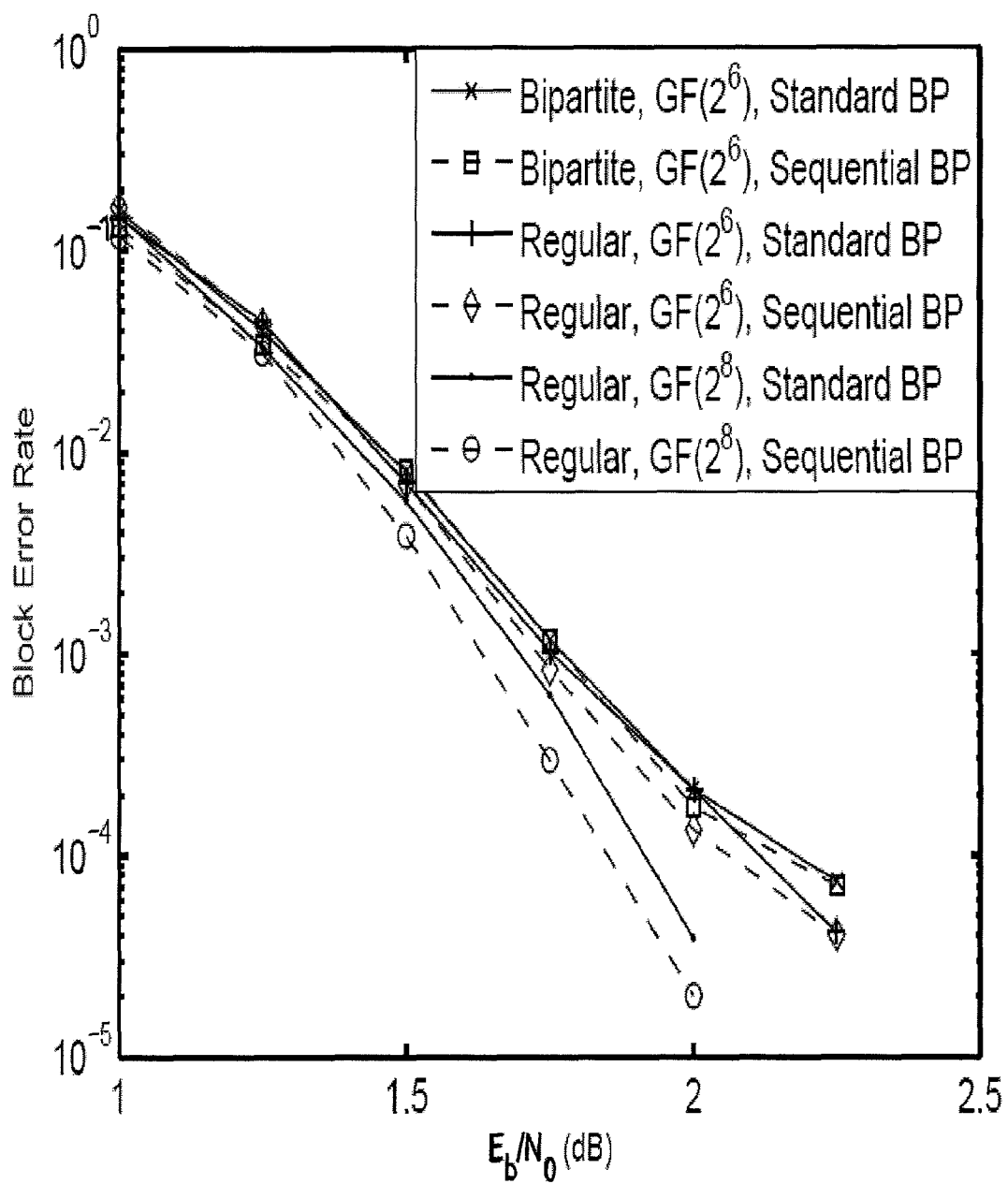
FIG. 9 depicts a performance comparison of exemplary sequential and standard BP decodings for the regular and bipartite regular cycle codes shown in FIG. 8.
Figure 10:
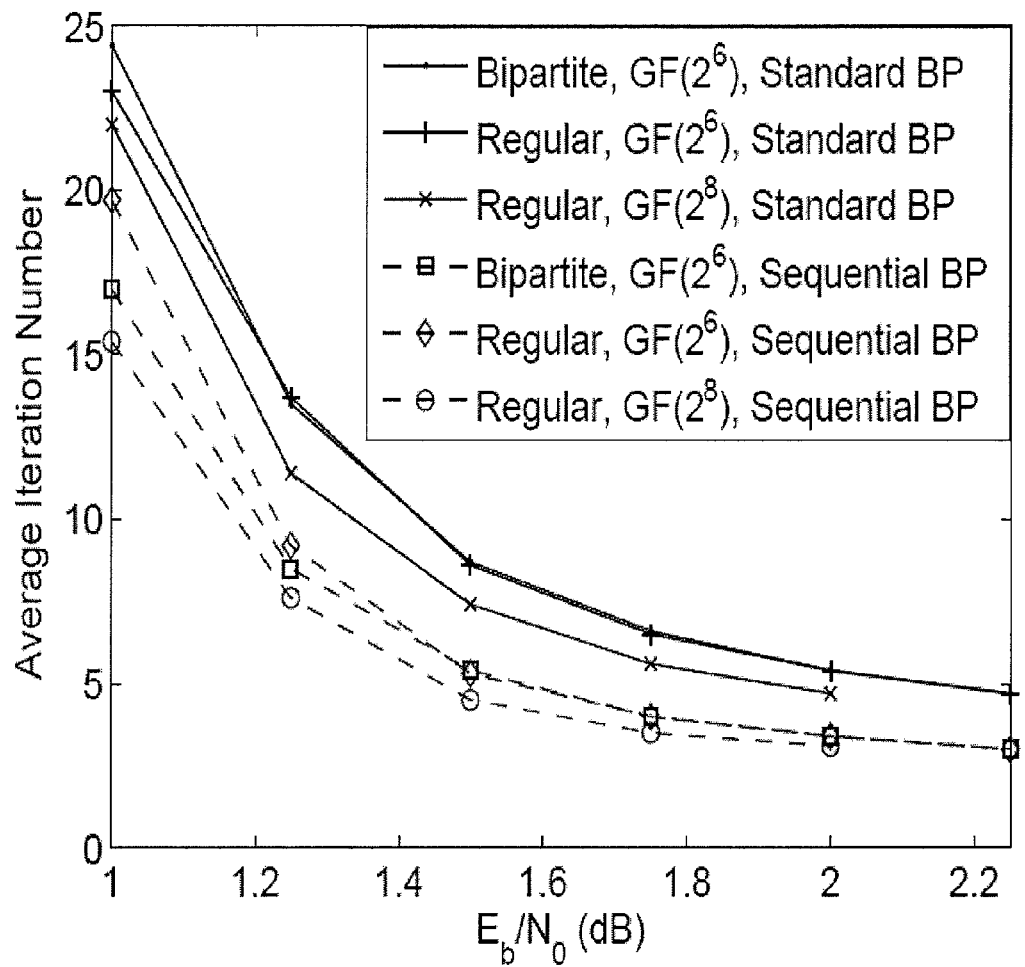
FIG. 10 depicts a performance comparison on the average number of iterations of exemplary sequential BP decoding and standard BP decoding for the exemplary regular and bipartite regular cycle codes shown in FIG. 8.

FIGS. 9 and 10 show the comparisons on the error performance and the average number of iterations between the proposed sequential BP decoding with parallel processing and standard BP decoding for those regular cycle GF(q) codes shown in FIG. 8. The maximum number of iterations was set to be 80. Of note, as shown by FIG. 9 the sequential BP decoding with parallel processing achieves slightly better performance than the standard parallel BP decoding. More importantly, FIG. 10 shows that the average number of iterations for the sequential BP decoding is about 30 percent less than that of the standard BP decoding at high SNR. Hence, the total decoding complexity for the proposed algorithm is 30 percent less than that for standard BP decoding algorithm. Moreover, the proposed parallel processing enables a speedup on the throughput of sequential BP decoding by a factor at least $2n/3d=10.5$ for the regular $GF(2^8)$ code and at least $2n/3d=14$ for the regular and bipartite regular $GF(2^6)$ codes.

Test Case 3 (Determination of Nonzero Entries of the Check Matrix)

Figure 11:
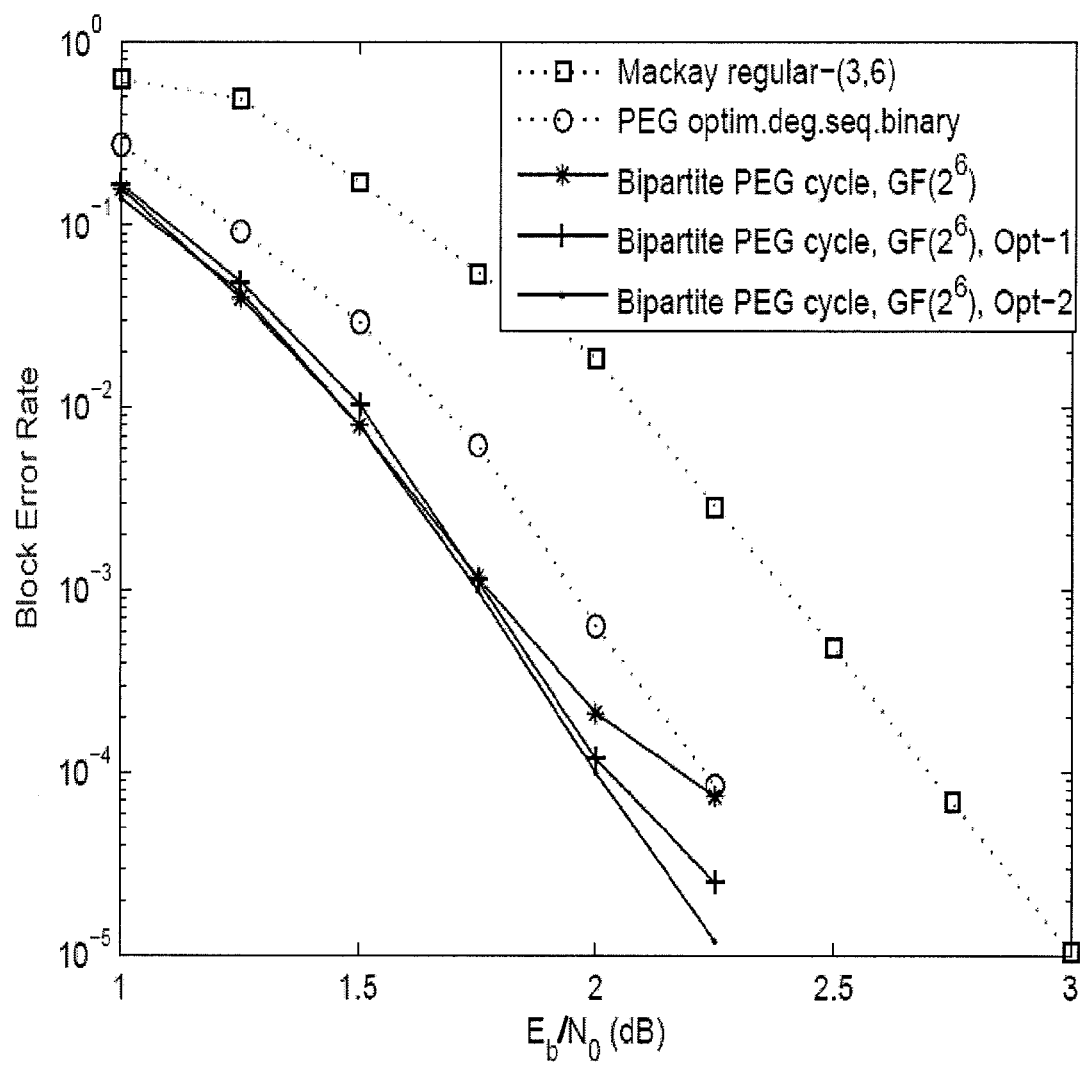
FIG. 11 depicts a performance comparison of exemplary cycle codes with different selections on nonzero entries under standard BP decoding up to 80 iterations with a codeword length of 1008 bits.

FIG. 11 shows the performance improvement for an exemplary embodiment when the design criterion C1 is applied to select the nonzero entries of the check matrix for the bipartite-graph based cycle code over $GF(2^6)$ in FIG. 8. The girth of the code's associated graph is 4 and it has been found that all of its cycles are of length 4, 6, 8 and 10. Solutions to satisfy all inequalities (e.g., the expression enumerated as (19) above) for cycles of length 4, 6, 8, and even 10 may be searched for using a random search. For the 'Opt-1' code in FIG. 11, all cycles of length 4 and 6 were rendered irresolvable. For the 'Opt-2' code in FIG. 11, all cycles of length 4, 6, and 8 were rendered irresolvable. Thus, FIG. 11 confirms that the proposed design criterion C1 can effectively lower the error floor for cycle GF(q) codes.

Test Case 4 (Codes Constructed Through Interleaver Design Vs. Codes Constructed by PEG)

Figure 12:
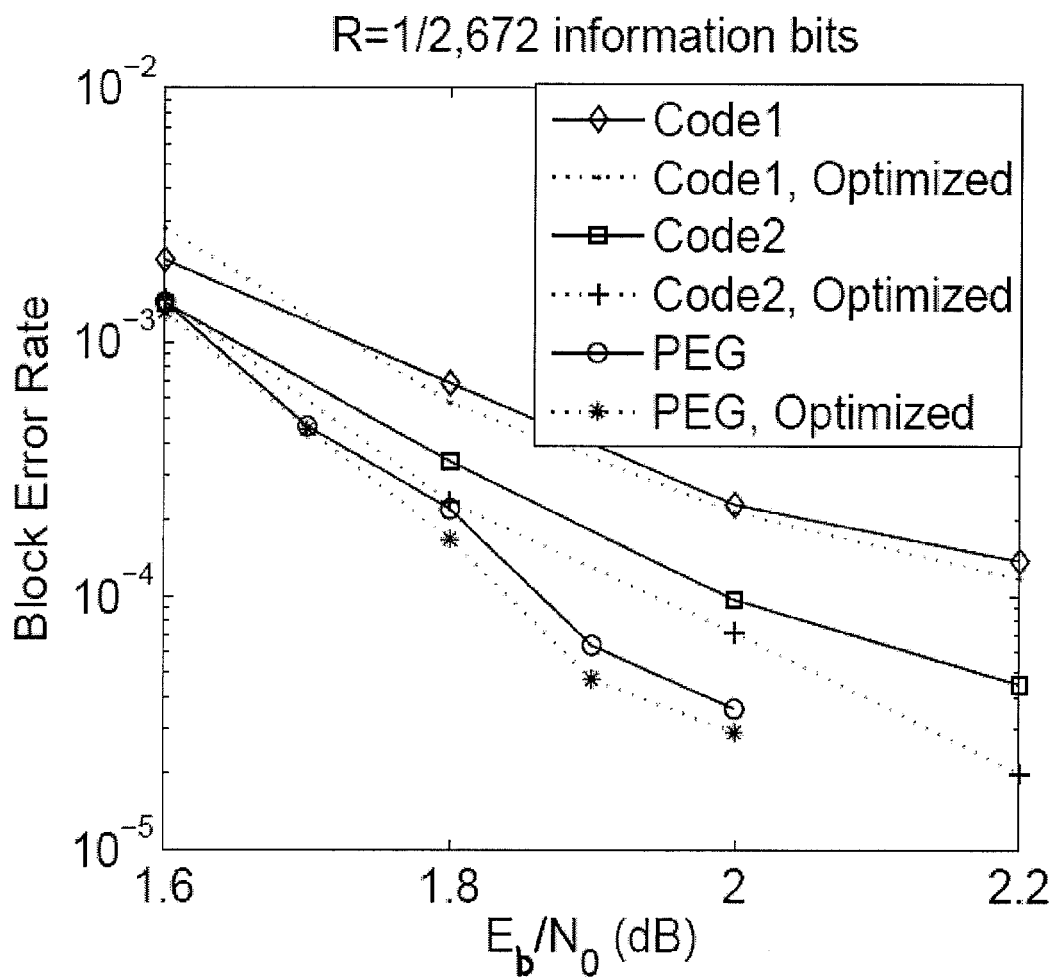
FIG. 12 depicts a performance comparison of exemplary regular cycle codes using semi-random interleavers and the progressive edge-growth (PEG) method with a codeword length of 1344 bits.

FIG. 12 shows a comparison of performance of regular cycle $GF(2^6)$ codes constructed from interleaver design with a cycle $GF(2^6)$ code constructed by the PEG algorithm. Semi-random interleavers were used in the embodiment. The proposed sequential BP with parallel processing was used for decoding regular cycle codes where the sequential BP for decoding the PEG constructed code was adopted. The maximum number of iterations was set to be 80. The code rate was ½ and the information symbol length was 112 symbols over $GF(2^6)$. The associated graph of 'Code2' is comprised of two edge-disjoint spanning cycles of length 112 and the associated graph of 'Code1' is comprised of two edge-disjoint 2-factors, where each 2-factor consists of 16 disjoint cycles of length 7. For the codes labeled with 'Optimized' the design criterion C1 to choose appropriate nonzero entries for the check matrices was applied. It can be seen from FIG. 12 that, compared with codes constructed by the PEG algorithm, the performance loss of regular cycle codes constructed using semi-random interleavers is only 0.15 dB at block-error-rate of $10^{-4}$. It is noted that careful interleaver design could further improve performance.

Other embodiments were simulated for performance analysis purposes using both an AWGN channel ($\hat{H}[k]=1, \forall k$ in the expression enumerated as (4) above) and an underwater Rayleigh fading channel. Specifically, the bandwidth was 12 kHz, and the channel delay spread is 10 ms, resulting in 120 channel taps in discrete-time. Equal-variance complex Gaussian random variables were used on each tap.

The two channel models are significantly different—one without channel fading and the other with multipath fading from a rich scattering environment. The coding performance based on these two different channel models was compared to facilitate code selection. It is also noted that practical underwater acoustic channels could be far more complex, e.g., with sparse multipath structure and much longer impulse response.

When the LDPC coding alphabet is matched to the modulation alphabet, i.e., p=b, or when p is an integer multiple of b, constellation labeling does not affect the error performance of the proposed system. Further, interleaving the codeword means a column rearrangement of the code's parity check matrix, implying that interleaving can be absorbed into the code design and does not need to be considered explicitly. In the following simulation results, Gray labeling and identity interleavers are used.

OFDM parameters were used as well. See, e.g., B. Li, S. Zhou, M. Stojanovic, L. Freitag, and P. Willett, "Multicarrier communication over underwater acoustic channels with non-uniform Doppler shifts," *IEEE J. Oceanic Eng.*, vol. 33, no. 2, April 2008 and B. Li, S. Zhou, M. Stojanovic, L. Freitag, J. Huang, and P. Willett, "MIMO-OFDM over an underwater acoustic channel," in *Proc. MTS/IEEE OCEANS conference*, Vancouver, BC, Canada, Sep. 29-Oct. 4, 2007. Each OFDM block is of duration 85.33 ms, and has 1024 subcarriers, out of which 672 subcarriers are used for data transmission and each OFDM block contains one codeword. The FFTQSPA algorithm is used for nonbinary LDPC decoding, where the maximum number of iterations is set to 80.

Test Case 5 (Combination of Coding and Modulation)

Figure 19:
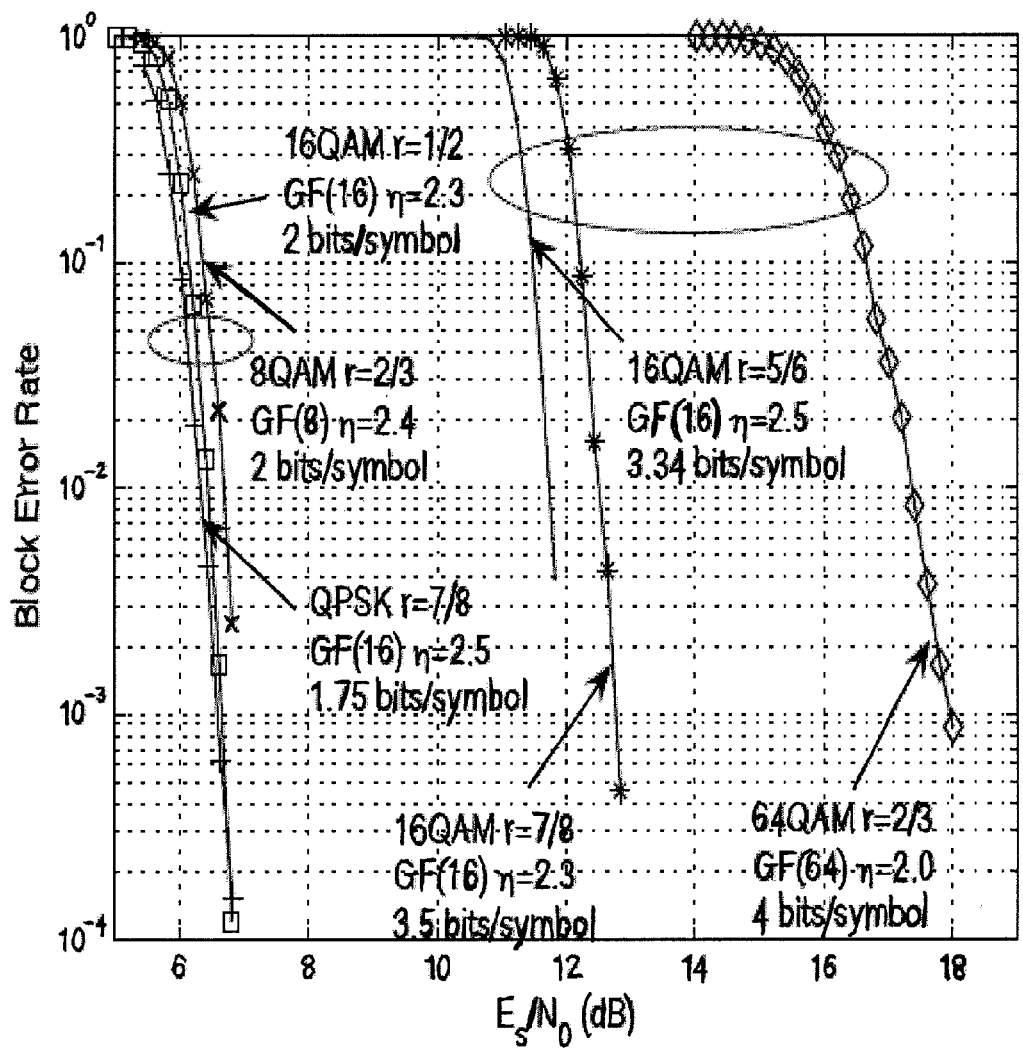
FIG. 19 depicts a performance comparison of exemplary LDPC codes of different coded modulation schemes over an AWGN channel.
Figure 20:
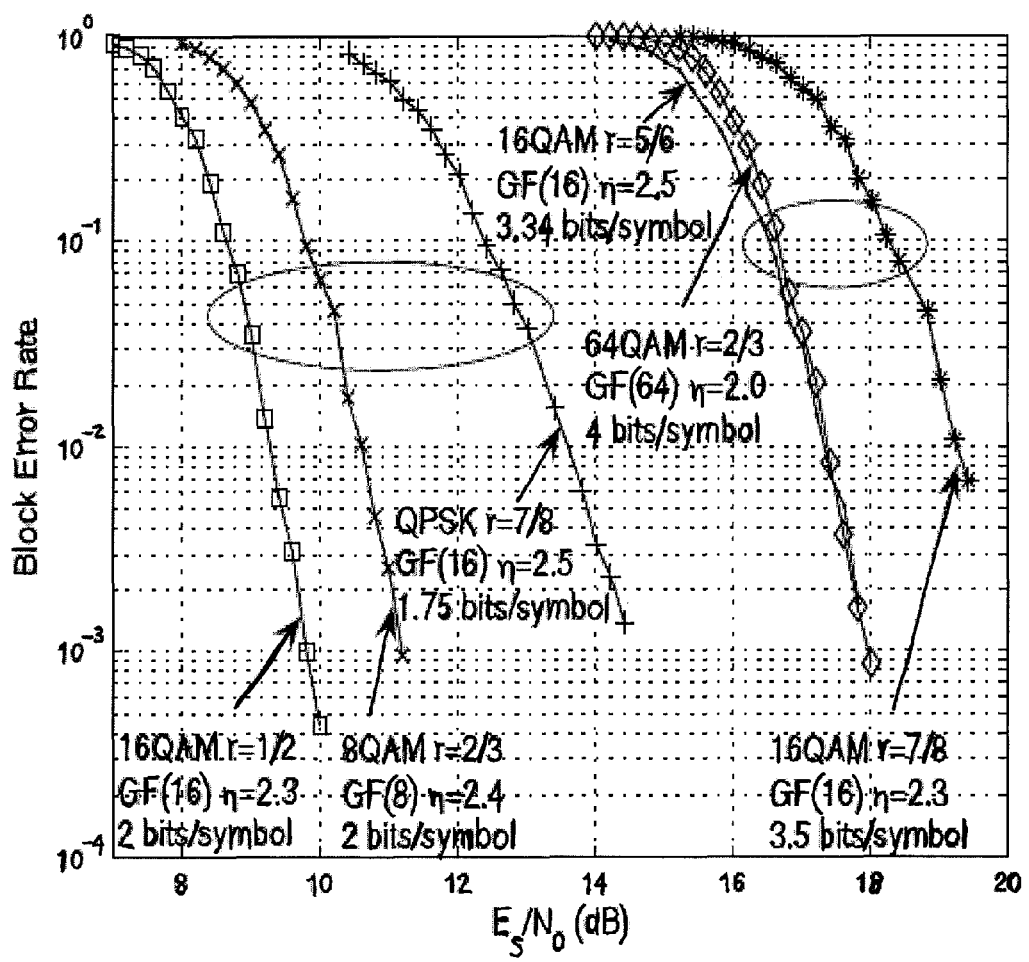
FIG. 20 depicts a performance comparison of exemplary LDPC codes of different coded modulation schemes over a Rayleigh fading channel.

FIGS. 19 and 20 show a comparison of the error performance of different exemplary coding and modulation combinations under the AWGN and Rayleigh fading channels, respectively. The following observation can be made:

A QPSK system with rate ⅞ coding over GF(16) leads to a data rate of 1.75 bits/symbol while a 16-QAM system with rate ½ coding over GF(16) and an 8-QAM system with rate ⅔ coding over GF(8) leads to a data rate of 2 bits/symbol. As seen in FIG. 19, the three systems achieved similar performance over the AWGN channel. However, as seen from FIG. 20, the QPSK system with rate ⅞ coding (and the 8-QAM system with rate ⅔ coding) is about 4 dB (1.3 dB) worse than the 16-QAM system with rate ½ over the Rayleigh fading channel at BLER of $10^{-2}$.

A 64-QAM system with rate ⅔ coding has a data rate of 4 bits/symbol, while a 16-QAM with rate ⅚ (⅞) coding has data rate of 3.34 (3.5) bits/symbol. As seen from FIG. 19, the 16-QAM system with rate ⅚ coding (and the 16-QAM system with rate ⅞ coding) achieves about 5.7 dB (5 dB) gain against the 64-QAM system with rate ⅔ coding at BLER of $10^{-2}$ over the AWGN channel. However, as seen from FIG. 20, the 16-QAM system with rate ⅚ coding has similar performance as the 64-QAM system with rate ⅔ coding over the Rayleigh fading channel, and the 16-QAM system with rate ⅞ coding is about 2 dB worse than the 64-QAM system with rate ⅔ coding over the Rayleigh fading channel at BLER of $10^{-2}$.

Hence, it is proposed that different coding and modulation combinations with a similar data rate could have quite different behaviors in the AWGN and Rayleigh fading channels. Without being bound by any theory, it is theorized that this effect may be due to the fact that different performance metrics matter for AWGN and Rayleigh fading channels. See, D. Divsalar and M. K. Simon, "The design of trellis coded MPSK for fading channels: performance criteria," *IEEE Trans. Commun.*, vol. 36, no. 9, pp. 1004-1012, September 1988. Specifically, minimum Hamming distance may play a significant role for the Rayleigh fading channel—while minimum Euclidean distance may play a significant role for the AWGN channel. In general, a combination of low rate code and large constellation can yield a larger Hamming distance than that of high rate code and small constellation, when the same spectral efficiency is achieved.

The performance of many different combinations of modulations such as BPSK, QPSK, 8-QAM, 16-QAM and 64-QAM, and LDPC codes of rate ½, ⅔, ¾, ⅚ and ⅞ were simulated. For LDPC codes over GF(q) where q<64, different combinations of value t (3 or 4) and η (range from 2.0 to 3.0) have been simulated. For LDPC codes over GF(64), exemplary nonbinary regular cycle codes from are used. For the bandwidth efficiency ranging from 0.5 to 5 bits/symbol, we only kept the combination that results in good performance in the Rayleigh fading channel and record the LDPC code parameters. It can be seen from Table I that low-rate codes (i.e., rate ½) are preferable.

TABLE I

NONBINARY LDPC CODES DESIGNED FOR UNDERWATER SYSTEM. η STANDS FOR MEAN COLUMN WEIGHT. EACH CODEWORD HAS 672b BITS WITH A SIZE-$2^b$ CONSTELLATION.

| Mode | Bits Per Symbol | Code Rate | η | t | Galois Field | Constellation |
|---|---|---|---|---|---|---|
| 1 | 0.5 | ½ | 2.8 | 4 | GF(4) | BPSK |
| 2 | 1 | ½ | 2.8 | 4 | GF(4) | QPSK |
| 3 | 1.5 | ½ | 2.8 | 4 | GF(8) | 8-QAM |
| 4 | 2 | ½ | 2.3 | 3 | GF(16) | 16-QAM |
| 5 | 3 | ½ | 2.0 | — | GF(64) | 64-QAM |
| 6 | 4 | ⅔ | 2.0 | — | GF(64) | 64-QAM |
| 7 | 5 | ⅚ | 2.0 | — | GF(64) | 64-QAM |

Test Case 6 (Performance of Different Modes)

Figure 13A:
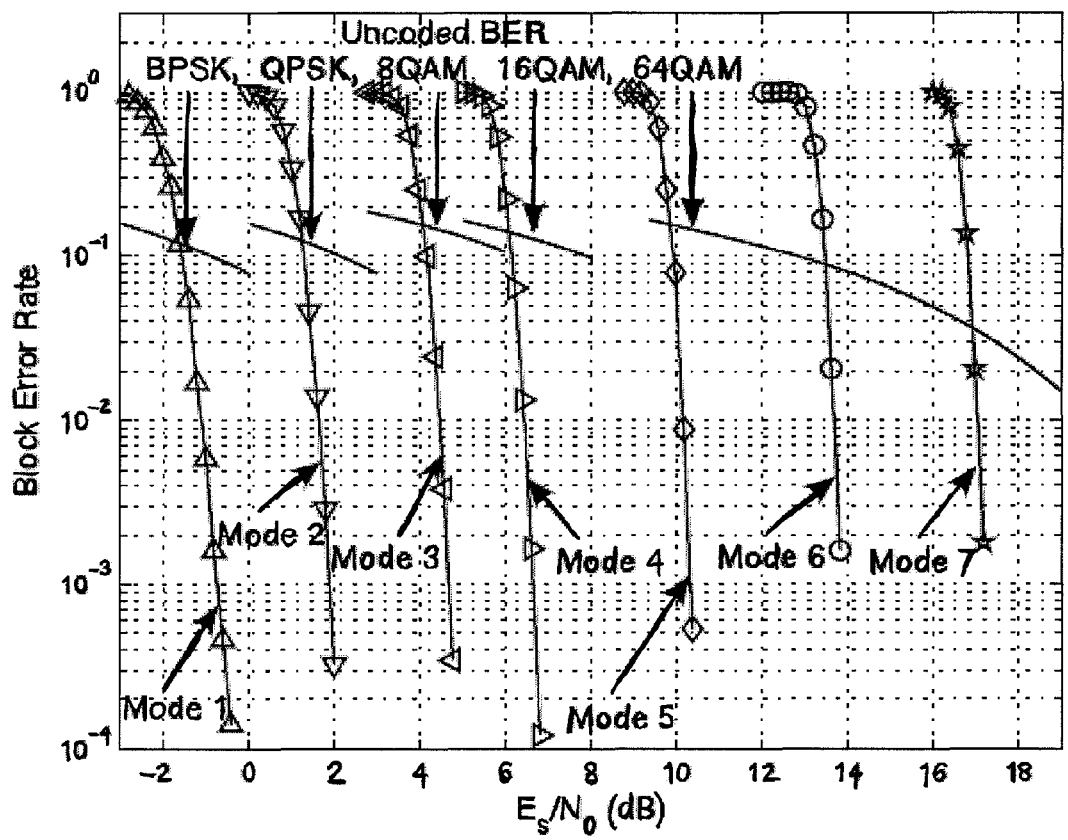
FIG. 13a depicts the block error rate (BLER) performance of exemplary LDPC codes of different modes over an AWGN channel.
Figure 13B:
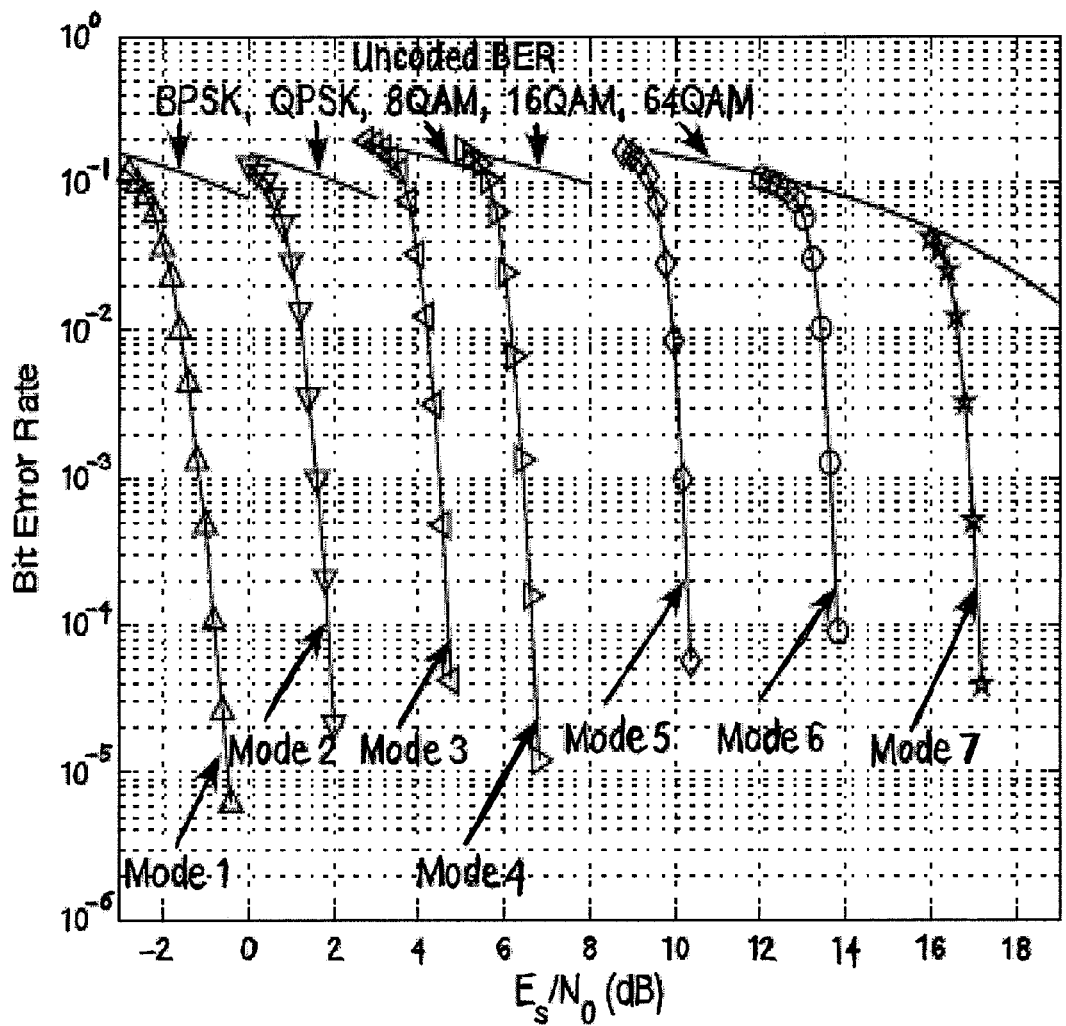
FIG. 13b depicts the bit error rate (BER) performance of exemplary LDPC codes of different modes over an AWGN channel.
Figure 14:
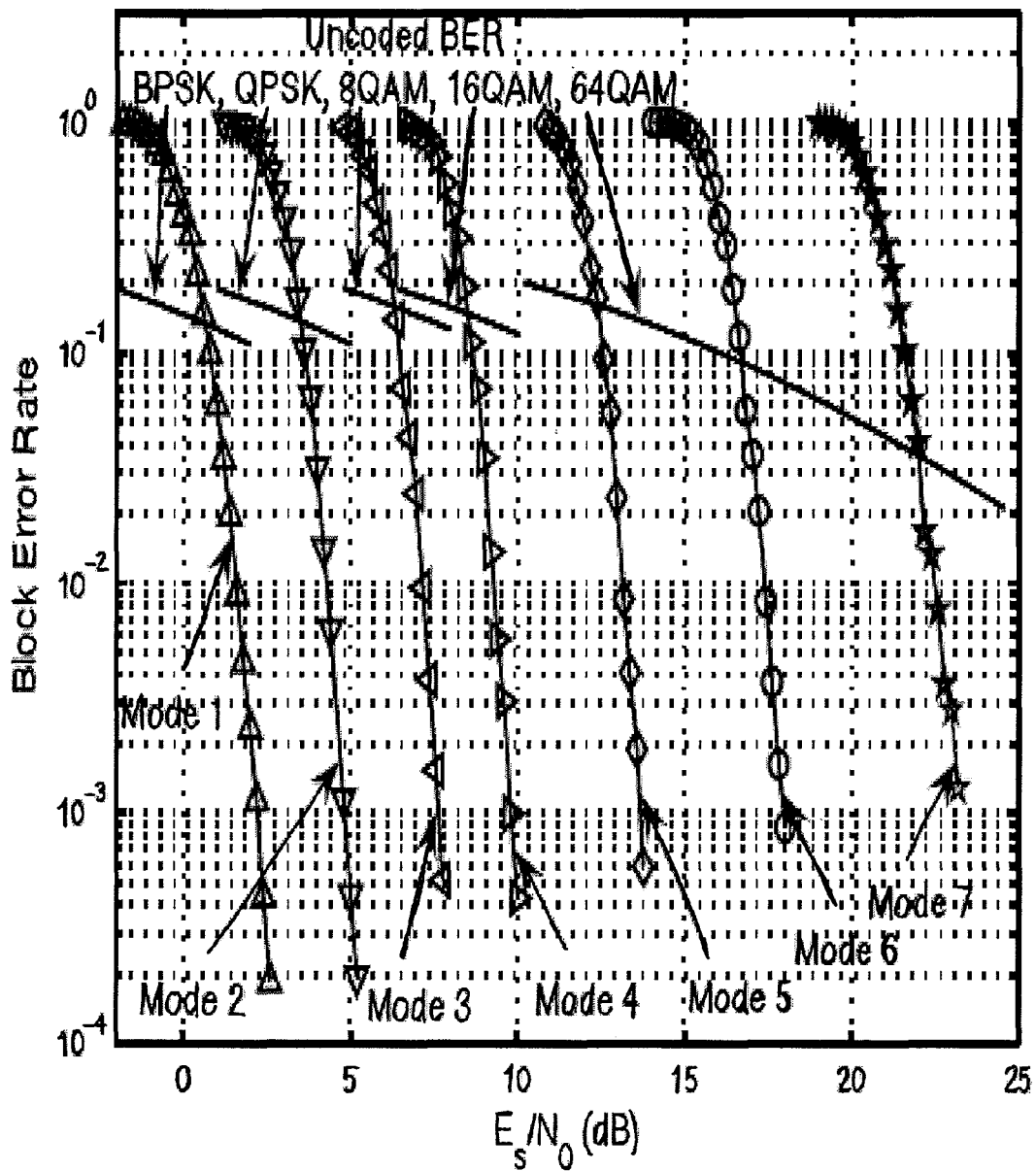
FIG. 14 depicts the BLER and BER performance of all the modes over OFDM Rayleigh fading channel and the uncoded BER curves for different modulations of exemplary nonbinary LPDC codes.
Figure 15:
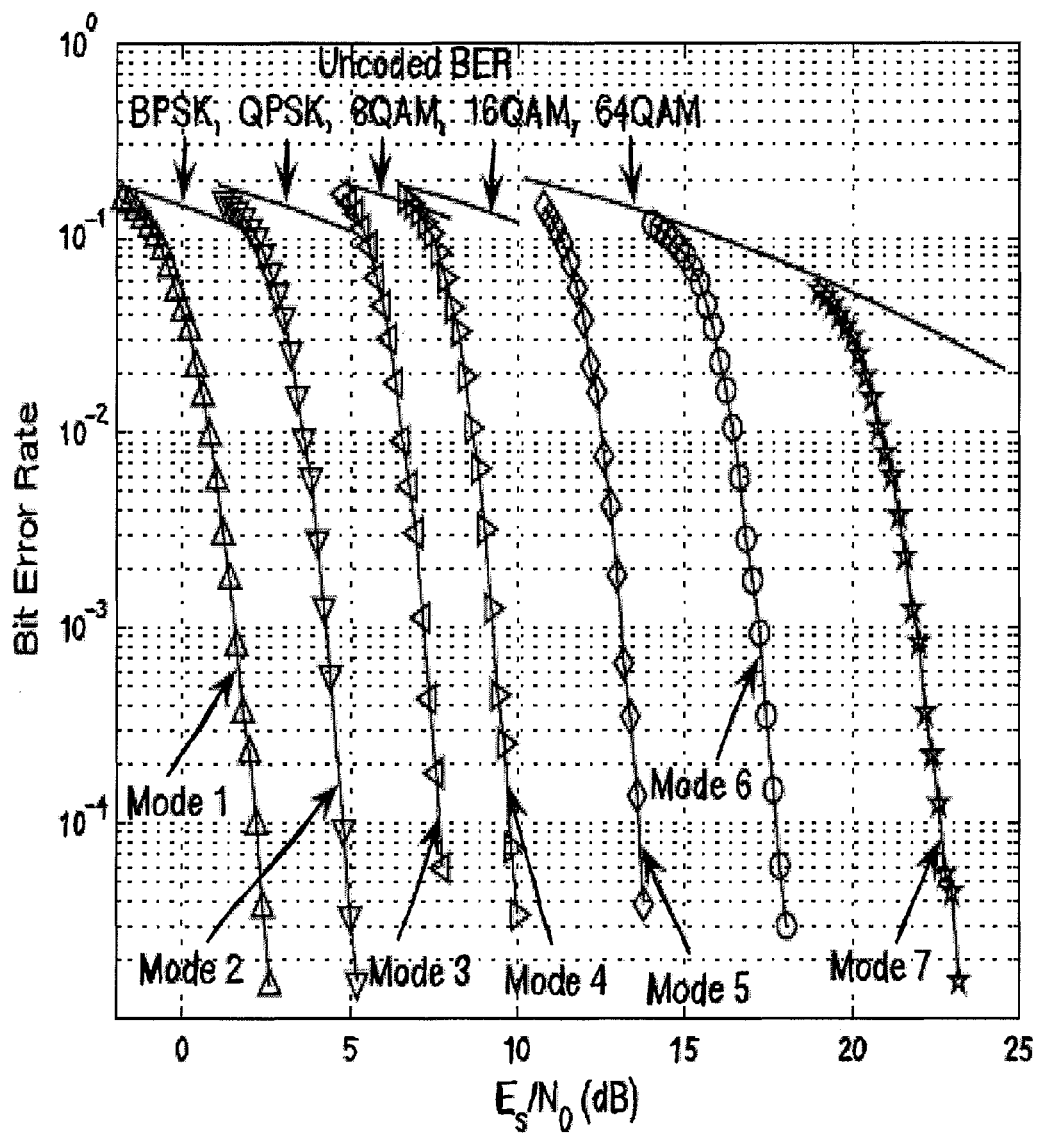
FIG. 15 depicts the BLER and BER performance of all the modes over OFDM Rayleigh fading channel and the uncoded BER curves for different modulations of exemplary nonbinary LPDC codes.

FIGS. 13a and 13b show the block error rate (BLER) and bit error rate (BER) performance of all the modes in Table I over an AWGN channel. Also included are the uncoded BER curves for different modulations. FIGS. 14 and 15 show the BLER and BER performance of all the modes in Table I over OFDM Rayleigh fading channel respectively.

Also included in FIGS. 13a, 13b, 14 and 15 are uncoded BER curves for different modulations or constellations. It can be seen that as long as uncoded BER is somewhat below 0.1, the coding performance improves drastically, approaching the waterfall behavior.

Test Case 7 (Comparison with CC Based BICM)

Figure 16:
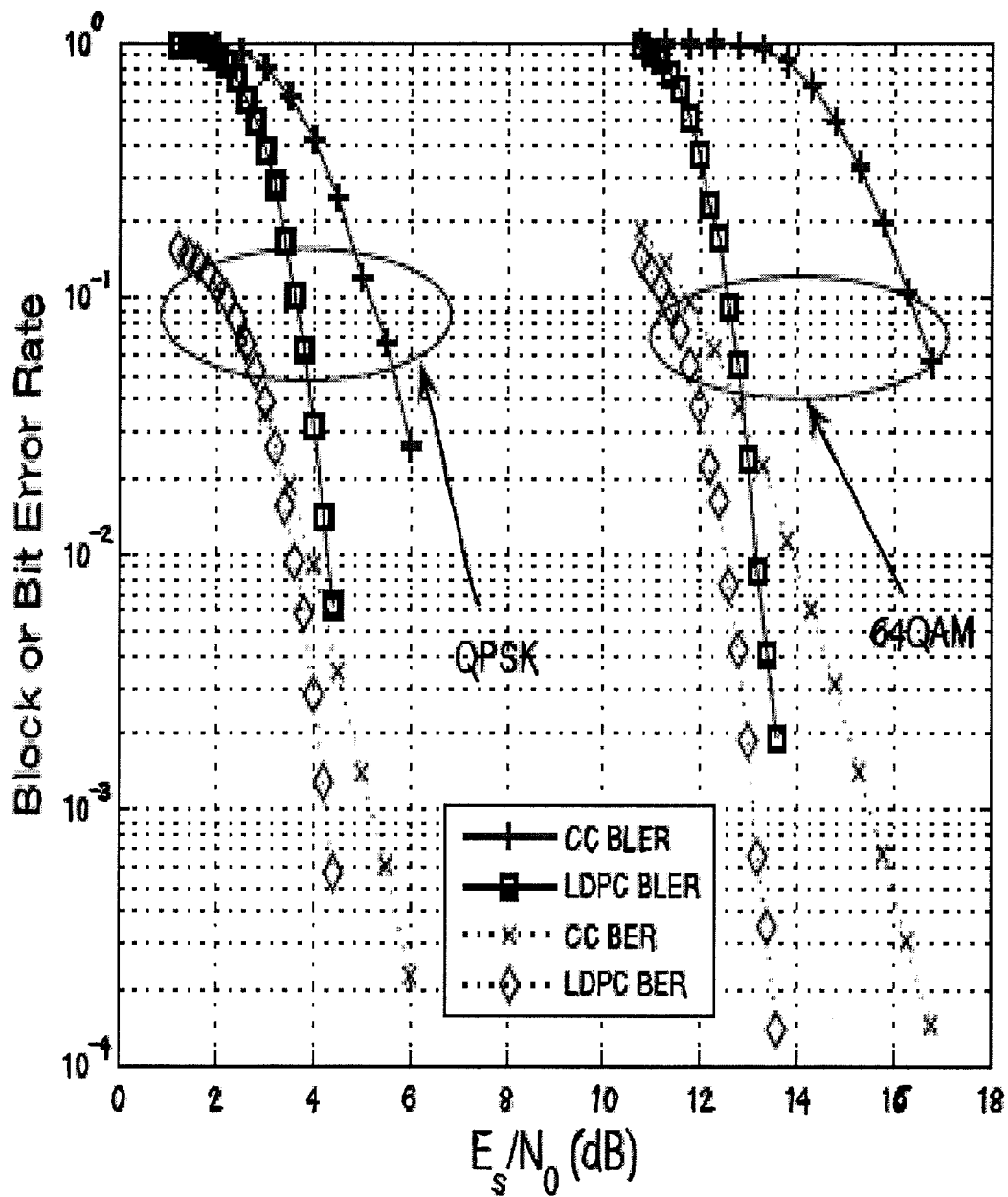
FIG. 16 depicts a comparison of exemplary LDPC and CC codes of rate 1/2 under different modulation over an OFDM Rayleigh fading channel.
Figure 21:
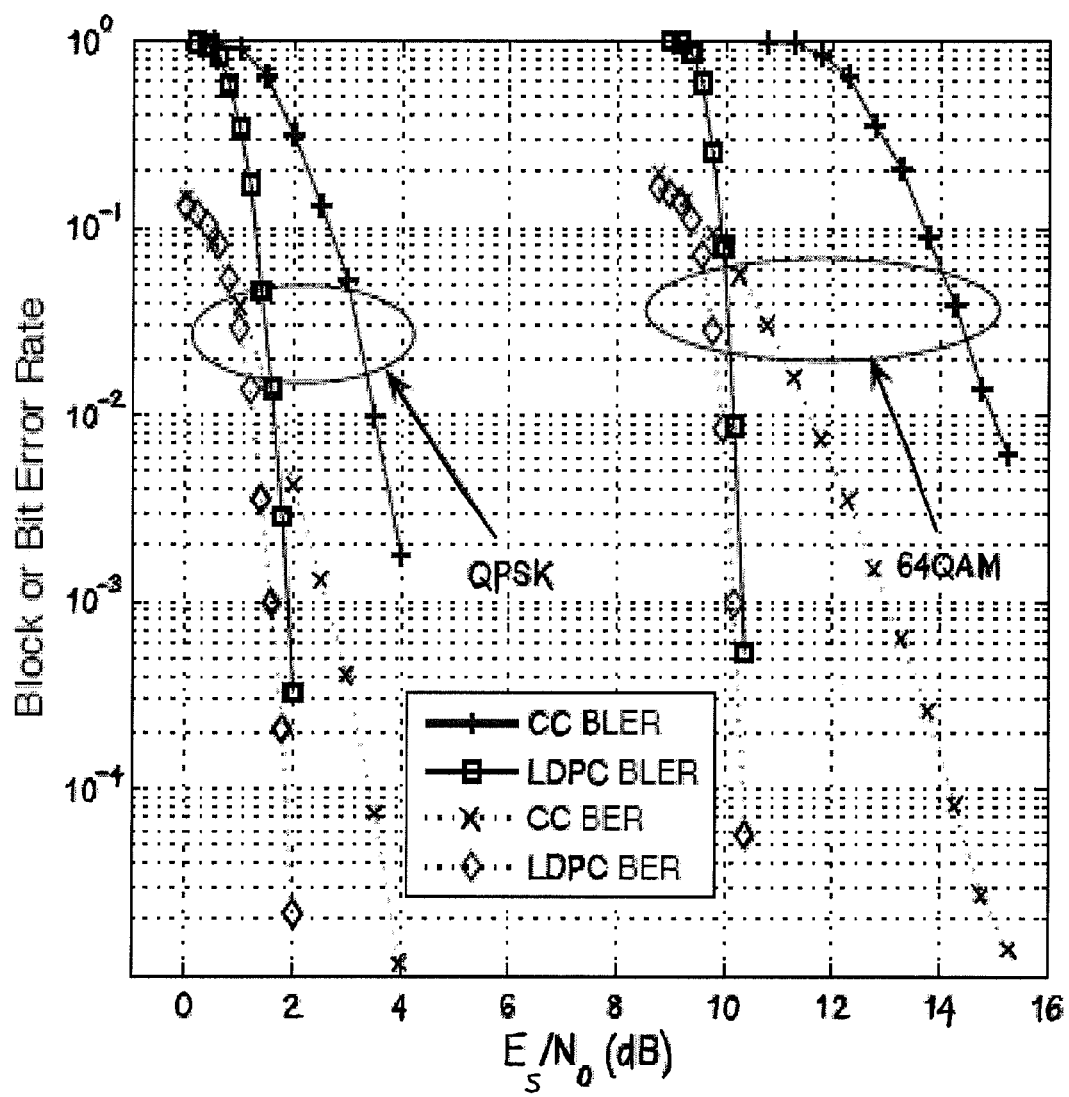
FIG. 21 depicts a comparison of exemplary LDPC and CC codes of rate ½ coding under different modulation over an AWGN channel.

FIGS. 16 and 21 show a comparison between the performance of a bit-interleaved coded-modulation (BICM) system based on a 64-state rate-½ convolutional code and the proposed nonbinary LDPC coding system under different modulation schemes over the OFDM Rayleigh fading channels, respectively. Gray labeling, random bit-level interleaver, and soft decision Viterbi decoding are used in the test BICM system. It can be seen from FIGS. 16 and 21 that compared with the BICM system using the convolutional code, nonbinary LDPC codes achieve several decibels (varying from 2 to 5 dB) performance gain at BLER of $10^{-2}$. It is noted that the performance of BICM may be considerably improved by using more powerful binary codes such as turbo codes and binary LDPC codes, and through iterative constellation demapping. See, e.g., X. Li and J. A. Ritcey, "Bit-interleaved coded modulation with iterative decoding," *IEEE Commun. Lett.*, vol. 1, no. 6, pp. 169-171, November 1997.

8. Test Results with Real Data

Proposed nonbinary regular and irregular LDPC codes for several underwater experiments have been used and the test results have been recorded and analyzed. See, e.g., B. Li, S. Zhou, M. Stojanovic, L. Freitag, J. Huang, and P. Willett, "MIMO-OFDM over an underwater acoustic channel," in *Proc. Of MTS/IEEE OCEANS conference*, Vancouver, Canada, Sep. 30-Oct. 4, 2007; and B. Li, S. Zhou, J. Huang, and P. Willett, "Scalable OFDM design for underwater acoustic communications," in *Proc. of Intl. Conf. on ASSP*, Las Vegas, Nev., Mar. 3-Apr. 4, 2008. In all experimental settings with nonbinary regular and irregular LDPC codes of the exemplary embodiments, nearly error-free performance was achieved. In fact, whenever the uncoded BER is below 0.1, decoding errors for rate 1/2 codes in the experiments were not observed. This finding is consistent with FIGS. 13a-15. Hence, the goal of OFDM demodulation can be summarized as achieving an uncoded BER to be within the range of 0.1 and 0.01, and therefore the coding will boost the system performance.

A. Field Test Results from Experiments at AUV Fest 2007 and Buzzards Bay, 2007

Nonbinary LDPC codes have been applied in a multicarrier system and data has been collected from experiments at AUV Fest, Panama City, Fla., June 2007, and at Buzzards Bay, Mass., August 2007. The detailed description of the experiments can be seen in B. Li, S. Zhou, J. Huang, and P. Willett, "Scalable OFDM design for underwater acoustic communications," in Proc. of Intl. Conf. on ASSP, Las Vegas, Nev., Mar. 30-Apr. 4, 2008, the entire contents of which is hereby expressly incorporated by reference herein.

In the AUV Fest, the sampling rate was 96 kHz. Signals with three different bandwidths, (3 kHz, 6 kHz, and 12 kHz, and centered around the carrier frequency 32 kHz) were used. The transmitter was about 9 m below a surface buoy. The receiving boat had an array in about 20 m depth water and the array depth was about 9 m to the top of the cage. Below, the results are reported with a transmission distance of about 500 m and the channel delay spread of about 18 ms.

In the Buzzards Bay test, the sampling rate was 400 kHz. Signals with two different bandwidths, 25 kHz and 50 kHz, centered around the carrier frequency 110 kHz, were used. The transmitter gear was deployed to the depth of about 6 m to about 7.6 m with a water depth about 14.3 m. The receiver array was deployed to the depth of about 6 m with a water depth about 14.3 m and an array spacing of about 0.2 m. Below, the results are reported with a transmission distance of about 180 m and a channel delay spread of about 2.5 ms. In both experiments, mode 2 (QPSK) and mode 4 (16-QAM) listed in Table I were adopted for nonbinary LDPC coding. In addition, included are signal sets with convolutional coding, where a 16-state rate ½ convolutional code with the generator polynomial (23,35) was used.

With QPSK modulation and rate ½ coding, the achieved spectral efficiency after accounting for various overheads was about 0.5 bits/sec/Hz, leading to data rates from 1.5 kbps to 25 kbps with different bandwidths from 3 kHz to 50 kHz. With 16-QAM modulation and rate ½ coding, the achieved spectral efficiency was about 1 bits/sec/Hz, leading to data rates from 12 kbps to 50 kbps with different bandwidths from 12 kHz to 50 kHz.

1) BER Performance for QPSK

BER results for convolutional codes (CC) with QPSK were collected and are shown in Table II, and those for the LDPC codes were collected and are shown in Table III. A total of 43008 information bits were transmitted in each setting. In some cases, there was no decoding error—even with a single receiver. Further, for all the cases tested, when signals from two receivers were properly combined there were no errors after channel decoding.

2) BER Performance for 16-QAM

Figure 22:
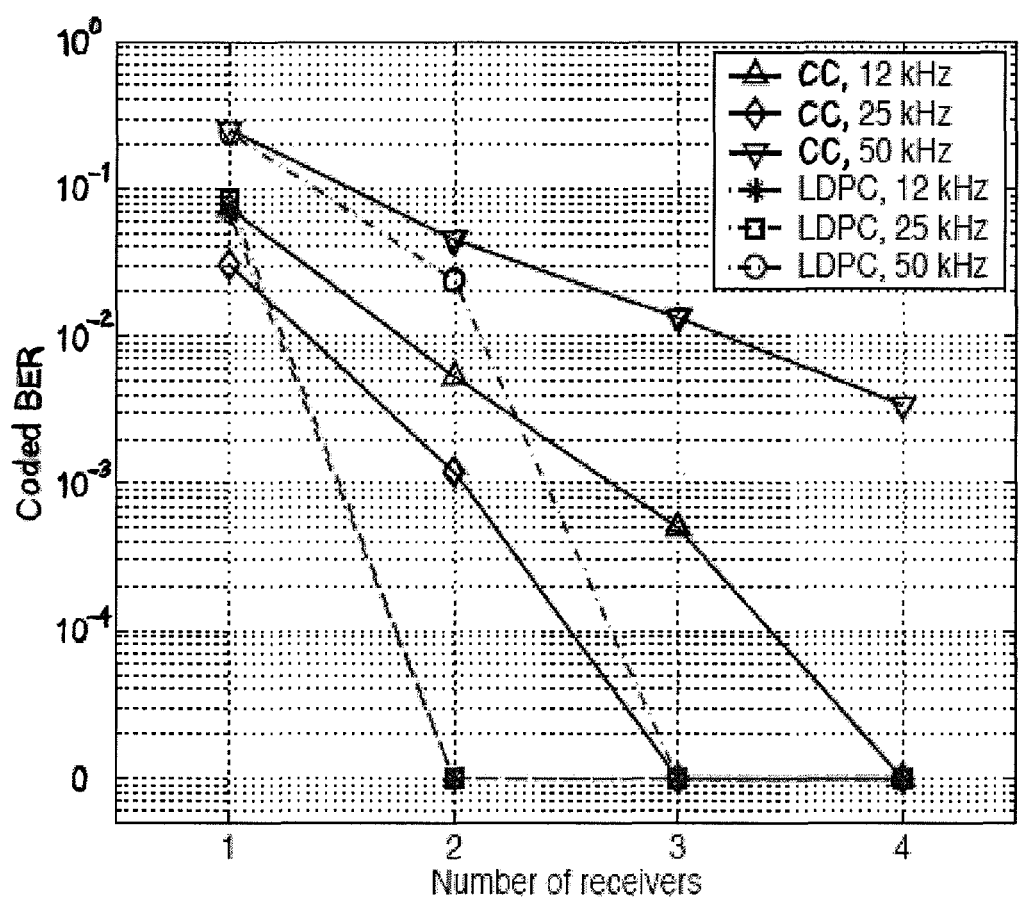
FIG. 22 depicts coded BER with 16-QAM constellation and rate of ½ coding of exemplary LDPC codes.

FIG. 22 shows the resultant BER values after channel decoding when 16-QAM was used. A total of 43008 information bits were transmitted in each setting. For the B=12 kHz case from the AUV Fest experiment, two receivers were needed for zero BER for LDPC, while four receivers were needed for zero BER for CC. For the B=25 kHz case from the Buzzards Bay test, two receivers were needed for zero BER for LDPC, while three receivers were needed for zero BER for CC. For the B=50 kHz case from the Buzzards Bay test, three receivers were needed for zero BER for LDPC, while for CC, a large BER still occurred with four receivers. Without being bound by any theory, it is believed that this phenomenon may have occurred because the nonbinary LDPC code has much better error-correction capability than the convolutional code used.

TABLE II

BER RESULTS FOR CC WITH QPSK

| Bandwidth B | 1 receiver uncoded/coded | 2 receivers uncoded/coded |
|---|---|---|
| AUV Fest, 3 kHz | 0.1219/0.0403 | 0.0395/0 |
| AUV Fest, 6 kHz | 0.0762/0.0063 | 0.0218/0 |
| AUV Fest, 12 kHz | 0.0752/0.0048 | 0.0185/0 |
| Bay Test, 25 kHz | 0.0016/0 | — |
| Bay Test, 50 kHz | 0.0834/0.0191 | 0.0243/0 |

TABLE III

BER RESULTS FOR LDPC WITH QPSK

| Bandwidth B | 1 receiver uncoded/coded | 2 receivers uncoded/coded |
|---|---|---|
| AUV Fest, 12 kHz | 0.0613/0 | — |
| Bay test, 25 kHz | 0.0015/0 | — |
| Bay test, 50 kHz | 0.1828/0.1851 | 0.1102/0 |

B. Field Test Results from the RACE08 Experiment

A Rescheduled Acoustic Communications Experiment (RACE) took place in Narragansett Bay, R.I., from Mar. 1 through Mar. 17, 2008. The water depths were in the range from about 9 to about 14 meters. The primary source for acoustic transmissions was located approximately 4 meters above the bottom. Three receiving arrays, one at about 400 meters to the east from the source, one at about 400 meters to the north from the source, and one at about 1000 meters to the north from the source, were located with the bottom of the arrays about 2 meters above the sea floor. The arrays at about 400 meters range were 24 element vertical arrays with a spacing of 5 cm between elements. The array at the about 1000 meter range was a 12 element vertical array with 12 cm spacing between elements. The sampling rate was fs=39.0625 kHz. The signal bandwidth was set as B=fs/8=4.8828 kHz, centered around the carrier frequency fc=11.5 kHz. Also, K=1024 subcarriers were used, which lead to a subcarrier spacing of Δf=4.8 Hz and the OFDM duration of T=209.7152 ms. The guard interval between consecutive OFDM blocks was Tg=25 ms. The transmission modes 2 to 5 were tested and are listed in Table I.

Our transmission file contained four packets. The first packet contained 36 OFDM blocks with QPSK modulation (Mode 2), the second packet contained 24 OFDM blocks with 8-QAM modulation (Mode 3), the third packet contained 18 OFDM blocks with 16-QAM modulation (Mode 4) and the fourth and last packet contained 12 OFDM blocks with 64-QAM modulation (Mode 5). Each packet has 24192 information bits regardless of the transmission mode. Accounting for the overheads of guard interval insertion, channel coding, pilot and null subcarriers, the spectral efficiency can be expressed as:

$$\beta = \frac{T}{T+T_g} \cdot \frac{672}{1024} \cdot \frac{1}{2} \cdot \log_2 M \text{ bits/sec/Hz}. \quad (25)$$

From this expression, the spectral efficiencies for the RACE08 experiment are 0.5864, 0.8795, 1.1727, and 1.7591 bits/sec/Hz, for transmission modes with QPSK, 8-QAM, 16-QAM, and 64-QAM constellations, respectively. Thus, the achieved data rates are 2.86, 4.29, 5.72, and 8.59 kbps, respectively. During the experiment, each transmission file was transmitted twice every four hours, leading to 12 transmissions per day. A total of 124 data sets were successfully recorded on each array within 13 days from the Julian date 073 to the Julian date 085.

Figure 23:
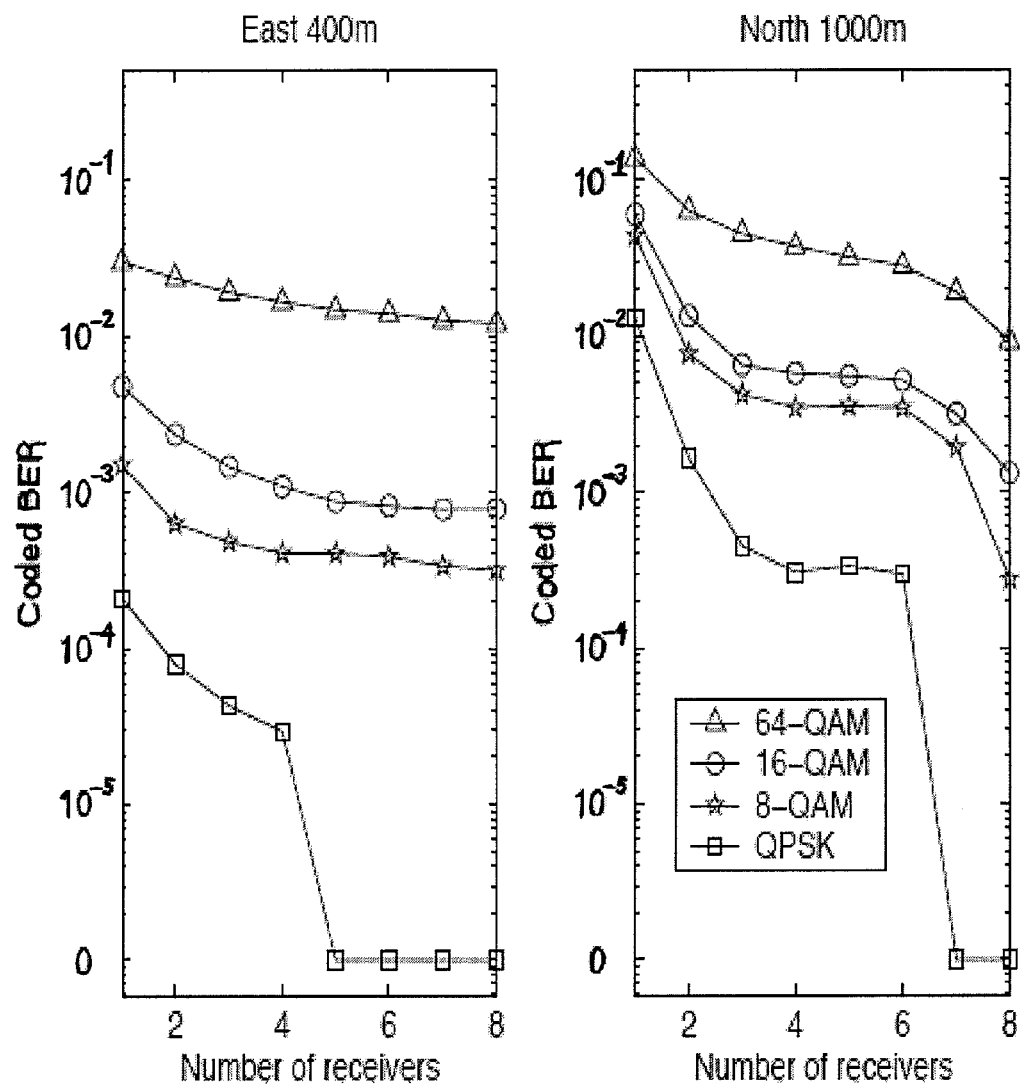
FIG. 23 depicts coded BER as a function of a number of receive-elements averaged over data collected from 13 days in an experiment of exemplary LDPC codes.
Figure 24:
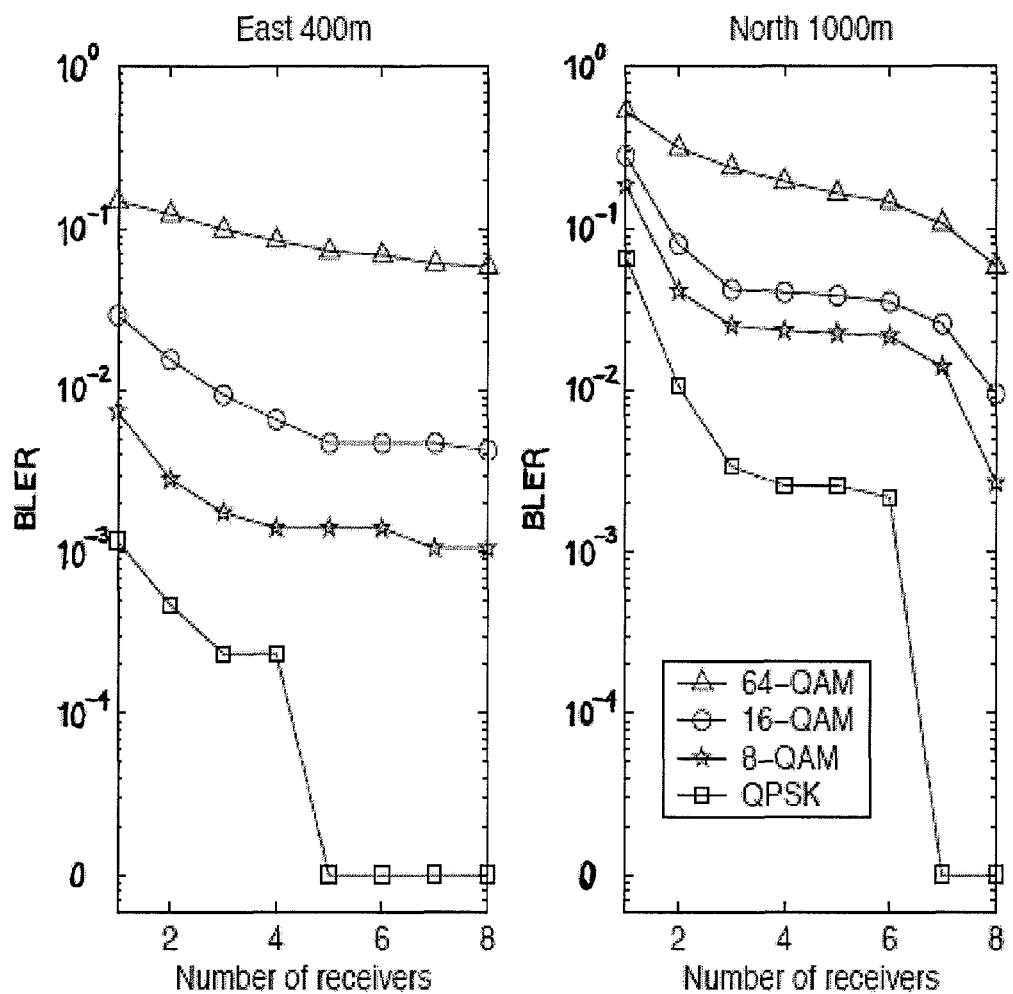
FIG. 24 depicts BLER as a function of a number of receive-elements averaged over data collected from 13 days in an experiment of exemplary LDPC codes.
Figure 25:
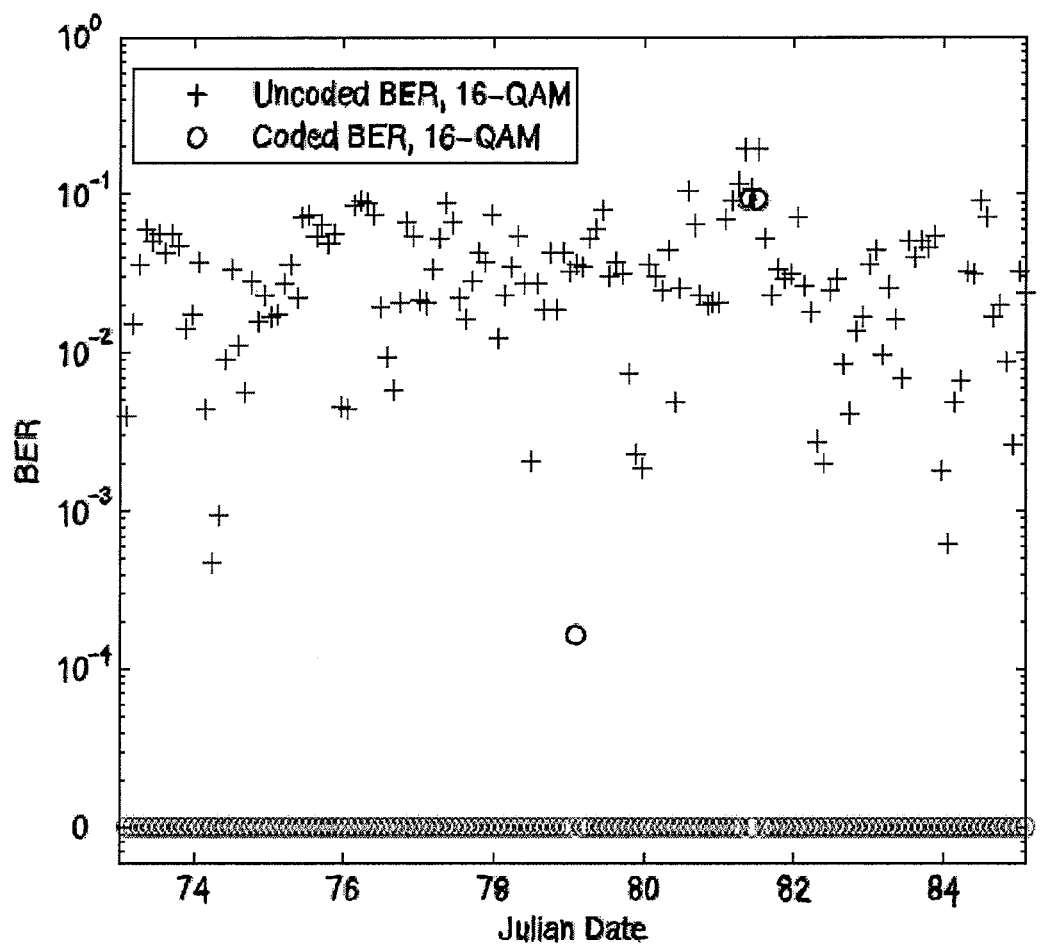
FIG. 25 depicts bit error rates in different Julian dates, North 1000 m, 8 receiver-elements and 16-QAM of exemplary LDPC codes.
Figure 26:
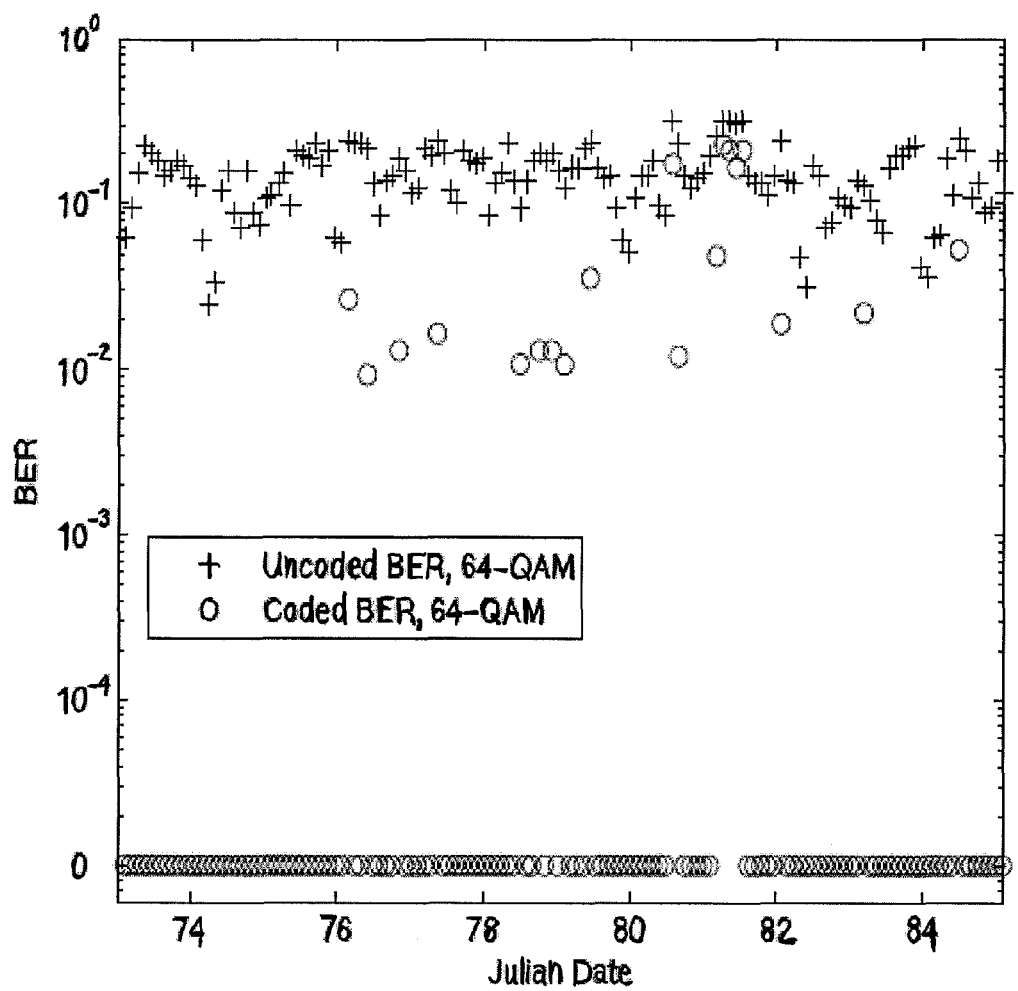
FIG. 26 depicts bit error rates in different Julian dates, North 1000 m, 8 receiver-elements and 64-QAM of exemplary LDPC codes.

The performance results on the array at 400 m to the east and on the array at 1000 m to the north are provided herein. The channel delay spreads were around 5 ms for both settings. FIGS. 23 and 24 depict the BER and BLER after channel decoding as a function of the number of receiver-elements, averaged over all the data sets collected from 13 days. Hence, each point in FIGS. 23 and 24 corresponds to transmissions of $124 \times 24192 \approx 3.0 \cdot 10^6$ information bits. FIGS. 25 and 26 plot the uncoded and coded BERs for each recorded data set at the array at 1000 m to the north across the Julian dates, for 16-QAM and 64-QAM constellations, respectively. It is noted that with 8 receiver-elements, error free performance was achieved during the 13 day operation for QPSK transmissions. Also, very good performance was achieved for 8-QAM and 16-QAM transmissions, as the BLER is below $10^{-2}$—which may satisfy the requirement of a practical system. Further, the average BLER was actually below 0.1 for 64 QAM constellation. A closer look at FIG. 26 shows that error-free transmissions were achieved for a large majority of transmissions. As a result, this experiment demonstrates that the proposed transmission modes are fairly robust to the varying channel conditions within those 13 days.

In summary, nonbinary LDPC coding has been applied in multicarrier underwater systems, where the focus was on matching the code alphabet with the modulation alphabet. The real data shows that whenever the uncoded BER is below 0.1, normally no decoding errors will occur for the rate ½ of the nonbinary LDPC codes used. This result is consistent with the simulation results in FIGS. 13a, 13b, 14 and 15, as the curves at the waterfall region are steep. The uncoded BER can serve as a quick performance indicator to assess how likely the decoding will succeed and, therefore, the goal of an OFDM receiver design may be to achieve an uncoded BER within the range of 0.1 and 0.01—as nonbinary LDPC coding will boost the overall system performance afterwards.

CONCLUSIONS

In preferred embodiments, apparatus, systems and methods of UWA communication are provided that include nonbinary regular low-density parity-check (LDPC) cycle codes if the constellation is large (e.g., modulation of at least 64-QAM or a Galois Field of at least 64) and nonbinary irregular LDPC codes if the constellation is small or moderate (e.g., modulation of less than 64-QAM or a Galois Field of less than 64). The nonbinary regular LDPC cycle codes have a parity check matrix with a fixed column weight of 2 and a fixed row weight. The nonbinary regular LDPC cycle code's parity check matrix can be put into a concatenation form of row-permuted block-diagonal matrices after row and column permutations if the row weight is even, or if the row weight is odd and the regular LDPC code's associated graph contains at least one spanning subgraph that includes disjoint edges. The nonbinary irregular LDPC codes have a parity check matrix with a first portion that is substantially similar to the parity check matrix of the regular LDPC cycle codes and a second portion that has a column weight greater than the column weight of the parity check matrix of the regular LDPC cycle codes.

The encoding of the embodiments utilizing this form can be performed in parallel in linear time. Decoding of the embodiments utilizing this form enables parallel processing in sequential BP decoding, which considerably increases the decoding throughput without compromising performance or complexity. In some embodiments, the storage requirements for H of cycle GF(q) codes is also reduced. Some of the exemplary embodiments result from code design strategies, such as the code structure design and the determination of nonzero entries of H. Extensive simulations confirm that the nonbinary regular and irregular LDPC codes of the exemplary embodiments have very good performance. In sum, this disclosure provides for the use of nonbinary regular and irregular LDPC codes in multicarrier underwater acoustic communication. The regular and irregular codes match well with the signal constellation, have excellent performance, and can be encoded in linear time and in parallel. Lastly, in some embodiments the use of LDPC codes reduces the peak to average power ratio in OFDM transmissions.

The apparatus, systems and methods of the present disclosure are typically implemented with conventional processing technology. Thus, programming is typically provided for operation on a processor, such programming being adapted to perform the noted operations for processing an acoustic signal in the manner disclosed herein. The processor may communicate with data storage and/or other processing elements, e.g., over a network, as is well known to persons skilled in the art. Thus, in exemplary implementations of the present disclosure, programming is provided that is adapted for a multicarrier based underwater acoustic (UWA) signal, such that a UWA signal is sent, received and processed according to the disclosed apparatus, systems and methods.

Although the present disclosure has been described with reference to exemplary embodiments and implementations thereof, the disclosed apparatus, systems, and methods are not limited to such exemplary embodiments/implementations. Rather, as will be readily apparent to persons skilled in the art from the description provided herein, the disclosed apparatus, systems and methods are susceptible to modifications, alterations and enhancements without departing from the spirit or scope of the present disclosure. Accordingly, the present disclosure expressly encompasses such modification, alterations and enhancements within the scope hereof.

What is claimed:

1. A method for underwater acoustic (UWA) communication, the method comprising the steps of:
(a) providing at least one nonbinary, low density parity check (LDPC) code to an encoder;
(b) with the encoder, encoding: (i) at least one nonbinary regular LDPC code if the constellation size of the at least one nonbinary LDPC code is a modulation of at least 64-QAM or a Galois Field of at least 64, or (ii) at least one nonbinary irregular LDPC code if the constellation size of the at least one nonbinary LDPC code is a modulation of less than 64-QAM or a Galois Field of less than 64;
(c) transmitting the at least one encoded LDPC code through an underwater transmitter on an orthogonal frequency division multiplexed (OFDM) UWA signal;
(d) receiving the at least one encoded LDPC code through an underwater receiver on the OFDM UWA signal;
(e) storing the received at least one encoded LDPC code; and
(f) decoding the received at least one encoded LDPC code.

2. The method of claim 1, wherein the at least one nonbinary regular LDPC code has a parity check matrix with a fixed column weight of 2 and a fixed row weight.

3. The method of claim 2, wherein the nonbinary regular LDPC code's parity check matrix can be put into a concatenation form of row-permuted block-diagonal matrices after row and column permutations if: (i) the row weight is even, or (ii) the row weight is odd and the nonbinary regular LDPC code's associated graph contains at least one spanning subgraph that includes disjoint edges.

4. The method of claim 1, wherein the at least one nonbinary irregular LDPC code has a parity check matrix with a first portion that is substantially similar to the parity check matrix of the at least one nonbinary regular LDPC code and a second portion that has a column weight greater than the column weight of the parity check matrix of the nonbinary regular LDPC code.

5. The method of claim 1, wherein the step of encoding is performed in parallel and in linear time.

6. The method of claim 1, wherein the step of decoding includes parallel processing in sequential belief propagation decoding.

7. The method of claim 1, wherein the received at least one nonbinary LDPC code is stored in memory associated with a processor.

8. The method of claim 1, further including the step of designing the at least one nonbinary LDPC code; and
wherein the step of designing the at least one nonbinary LDPC code includes determining the code structure design.

9. The method of claim 8, wherein the code structure design is determined based on a regular graph, a computer search or the equivalent form of the check matrix.

10. The method of claim 8, wherein the step of designing the at least one nonbinary LDPC code includes determining the nonzero entries; and
wherein nonzero entries are chosen to increase the number of irresolvable cycles.

11. The method of claim 1, wherein the at least one nonbinary irregular LDPC code or the at least one nonbinary regular LDPC code reduces the peak-to-average power ratio of the OFDM signal.

12. An underwater acoustic (UWA) communications system comprising:
(a) an encoder adapted to receive at least one nonbinary, LDPC code and to encode: (i) at least one nonbinary regular LDPC code if the constellation size of the at least one nonbinary LDPC code is a modulation of at least 64-QAM or a Galois Field of at least 64, or (ii) at least one nonbinary irregular LDPC code if the constellation size of the at least one nonbinary LDPC code is a modulation of less than 64-QAM or a Galois Field of less than 64;

(b) an underwater transmitter in communication with the encoder, the underwater transmitter adapted to transit the at least one encoded LDPC code through an orthogonal frequency division multiplexed (OFDM) UWA signal;

(c) one or more underwater receiving elements adapted to receive the at least one encoded LDPC code on the OFDM UWA signal;

(d) memory adapted to store the received at least one encoded LDPC code; and (e) a decoder adapted to decode the received at least one encoded LDPC code.

13. The system of claim 12, wherein the at least one nonbinary regular LDPC code has a parity check matrix with a fixed column weight of 2 and a fixed row weight.

14. The system of claim 13, wherein the nonbinary regular LDPC code's parity check matrix can be put into a concatenation form of row-permuted block-diagonal matrices after row and column permutations if: (i) the row weight is even, or (ii) the row weight is odd and the nonbinary regular LDPC code's associated graph contains at least one spanning subgraph that includes disjoint edges.

15. The system of claim 14, wherein the at least one nonbinary irregular LDPC code or the at least one nonbinary regular LDPC code reduces the peak-to-average power ratio of the OFDM signal.

16. The system of claim 12, wherein the at least one nonbinary irregular LDPC code has a parity check matrix with a first portion that is substantially similar to the parity check matrix of the at least one nonbinary regular LDPC code and a second portion that has a column weight greater than the column weight of the parity check matrix of the nonbinary regular LDPC code.

17. The system of claim 12, wherein the step of encoding is performed in parallel and in linear time.

18. The system of claim 12, wherein the step of decoding includes parallel processing in sequential belief propagation decoding.

19. The system of claim 12, further including the step of designing the at least one nonbinary LDPC code; and wherein the step of designing the at least one LDPC code includes determining the code structure design.

20. The system of claim 19, wherein the code structure design is determined based on a regular graph, a computer search or the equivalent form of the check matrix.

21. The method of claim 19, wherein the step of designing the at least one LDPC code includes determining the nonzero entries; and wherein nonzero entries are chosen to increase the number of irresolvable cycles.

* * * * *